United States Patent
Larsen et al.

(10) Patent No.: US 7,893,414 B2
(45) Date of Patent: Feb. 22, 2011

(54) APPARATUS AND METHOD FOR ABSORPTION OF INCIDENT GAMMA RADIATION AND ITS CONVERSION TO OUTGOING RADIATION AT LESS PENETRATING, LOWER ENERGIES AND FREQUENCIES

(75) Inventors: Lewis G. Larsen, Chicago, IL (US); Allan Widom, Brighton, MA (US)

(73) Assignee: Lattice Energy LLC, Chicago, IL (US)

( * ) Notice: Subject to any disclaimer, the term of this patent is extended or adjusted under 35 U.S.C. 154(b) by 357 days.

(21) Appl. No.: 12/065,784

(22) PCT Filed: Sep. 8, 2006

(86) PCT No.: PCT/US2006/035110
§ 371 (c)(1),
(2), (4) Date: Aug. 14, 2008

(87) PCT Pub. No.: WO2007/030740
PCT Pub. Date: Mar. 15, 2007

(65) Prior Publication Data
US 2008/0296519 A1    Dec. 4, 2008

Related U.S. Application Data

(60) Provisional application No. 60/715,622, filed on Sep. 9, 2005.

(51) Int. Cl.
*G21F 7/00* (2006.01)

(52) U.S. Cl. .................................. 250/515.1; 250/505.1
(58) Field of Classification Search ............... 250/505.1, 250/515.1
See application file for complete search history.

(56) References Cited

U.S. PATENT DOCUMENTS 5,887,042 A    3/1999    Akamatsu et al.

OTHER PUBLICATIONS

International Search Report re application No. PCT/US2006/035110, dated Mar. 14, 2007.
Written Opinion re application No. PCT/US2006/035110, dated Mar. 14, 2007.

*Primary Examiner*—Robert Kim
*Assistant Examiner*—Hanway Chang
(74) *Attorney, Agent, or Firm*—Edward D. Manzo; Husch Blackwell LLP

(57) ABSTRACT

Gamma radiation (22) is shielded by producing a region of heavy electrons (4) and receiving incident gamma radiation in such region. The heavy electrons absorb energy from the gamma radiation and re-radiate it as photons (38, 40) at a lower energy and frequency. The heavy electrons may be produced in surface plasmon polaritons. Multiple regions (6) of collectively oscillating protons or deuterons with associated heavy electrons may be provided. Nanoparticles of a target material on a metallic surface capable of supporting surface plasmons may be provided. The region of heavy electrons is associated with that metallic surface. The method induces a breakdown in a Born-Oppenheimer approximation Apparatus and method are described.

23 Claims, 24 Drawing Sheets

Schematic conceptual diagram showing absorption of a gamma photon by a heavy electron and re-radiation of the energy received from the gamma photon as a mixture of outgoing infrared and soft X-ray photons Figure 1. Relative positions of infrared, X-ray, and gamma ray regions within the electromagnetic spectrum

| Entire Spectrum of Electromagnetic Radiation ||||| 
|---|---|---|---|---|
| Region | Wavelength (Angstroms) | Wavelength (centimeters) | Frequency (Hz) | Energy (eV) |
| Radio | $> 10^9$ | $> 10$ | $< 3 \times 10^9$ | $< 10^{-5}$ |
| Microwave | $10^9 - 10^6$ | $10 - 0.01$ | $3 \times 10^9 - 3 \times 10^{12}$ | $10^{-5} - 0.01$ |
| Infrared | $10^6 - 7000$ | $0.01 - 7 \times 10^{-5}$ | $3 \times 10^{12} - 4.3 \times 10^{14}$ | $0.01 - 2$ |
| Visible | $7000 - 4000$ | $7 \times 10^{-5} - 4 \times 10^{-5}$ | $4.3 \times 10^{14} - 7.5 \times 10^{14}$ | $2 - 3$ |
| Ultraviolet | $4000 - 10$ | $4 \times 10^{-5} - 10^{-7}$ | $7.5 \times 10^{14} - 3 \times 10^{17}$ | $3 - 10^3$ |
| X-Rays | $10 - 0.1$ | $10^{-7} - 10^{-9}$ | $3 \times 10^{17} - 3 \times 10^{19}$ | $10^3 - 10^5$ |
| Gamma Rays | $< 0.1$ | $< 10^{-9}$ | $> 3 \times 10^{19}$ | $> 10^5$ |

Figure 2. Relative position of gamma rays in the electromagnetic spectrum
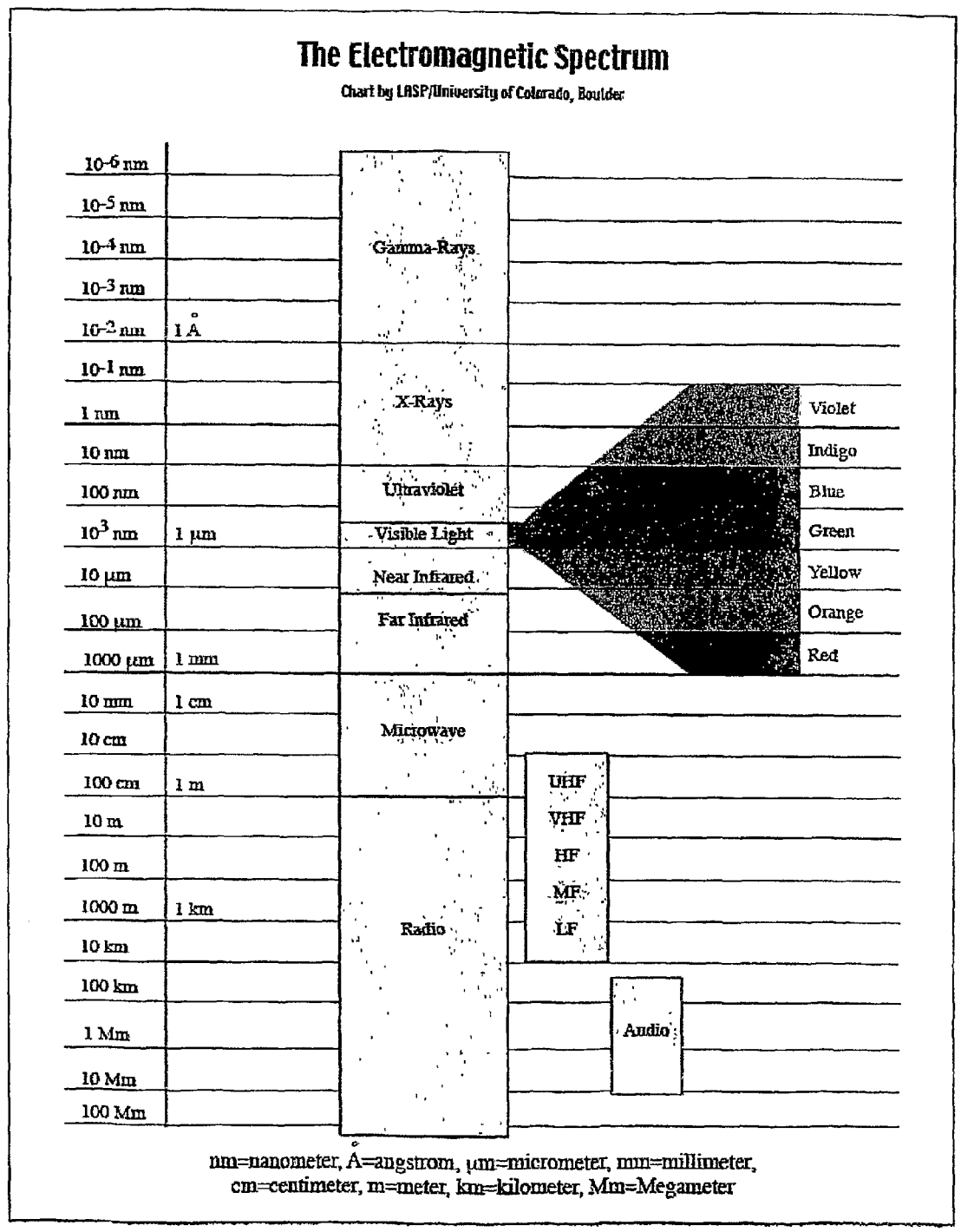

Figure 3. Photoelectric Effect – primarily low energy photons with E ≤ 0.5 MeV
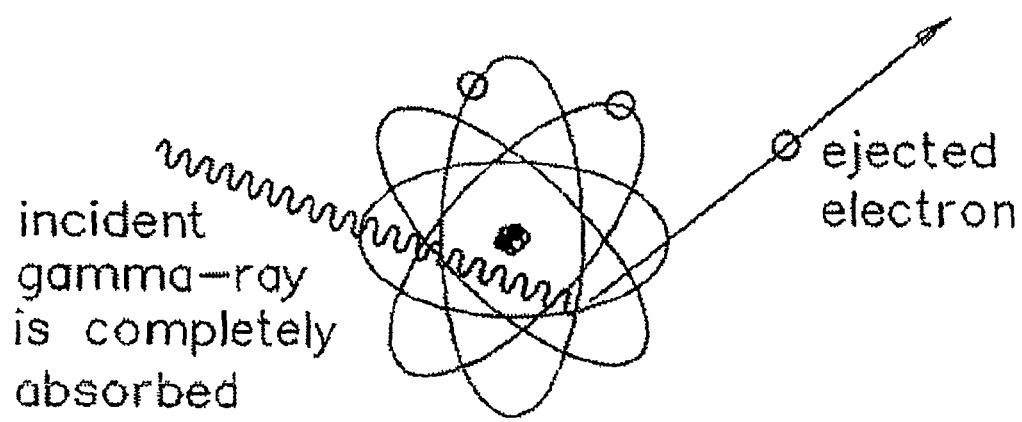
Image: Adapted after TRIUMF graphic Figure 4. Compton Scattering – primarily medium-energy photons with $0.5 \leq E \leq 5.0$ MeV
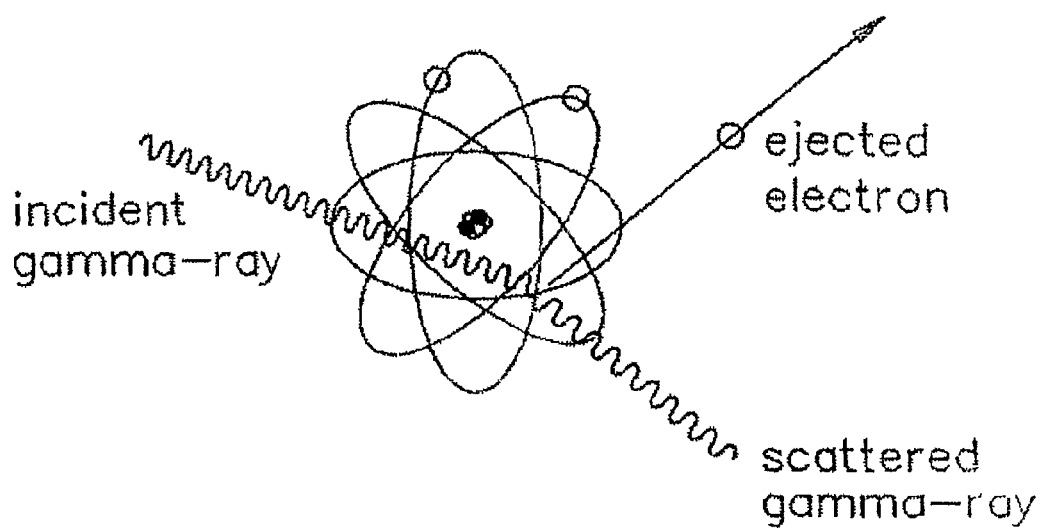
Image: Adapted after TRIUMF graphic Figure 5. Pair Production – primarily high-energy gamma photons with E > 5.0 MeV
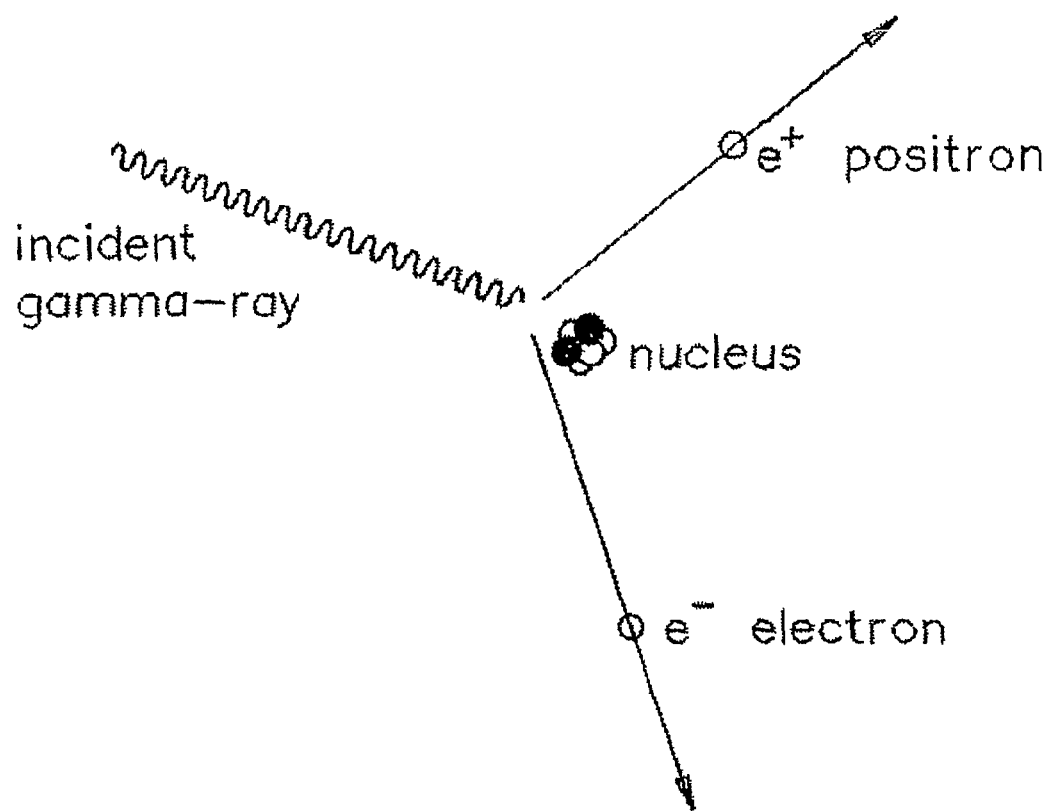
Image: Adapted after TRIUMF graphic Figure 6. Relative contributions of each process as a function of a "target" atom's nuclear charge (Z or atomic number of absorber) versus incident gamma photon energy (MeV)
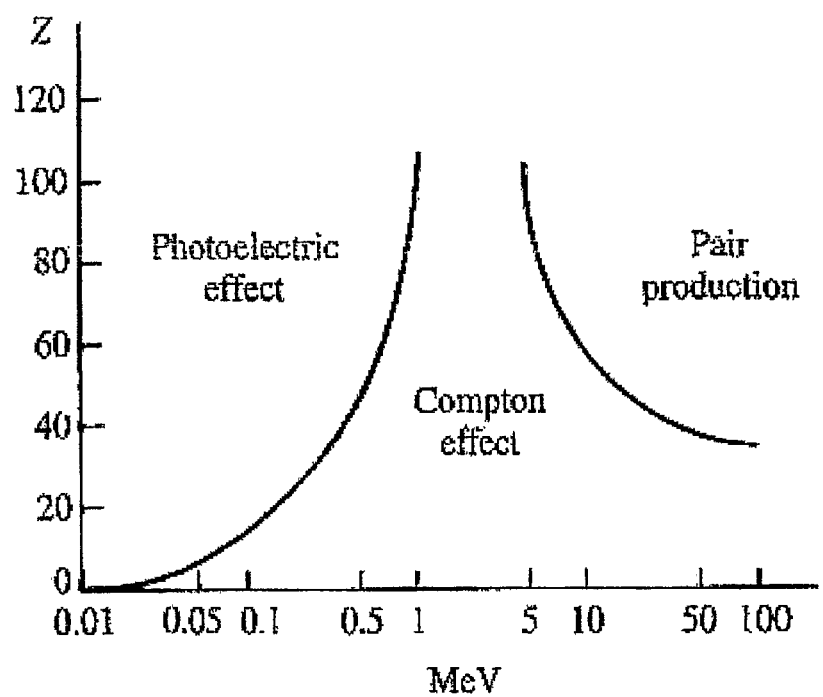

Figure 7. High-energy photon absorption cross sections versus photon energy for Carbon
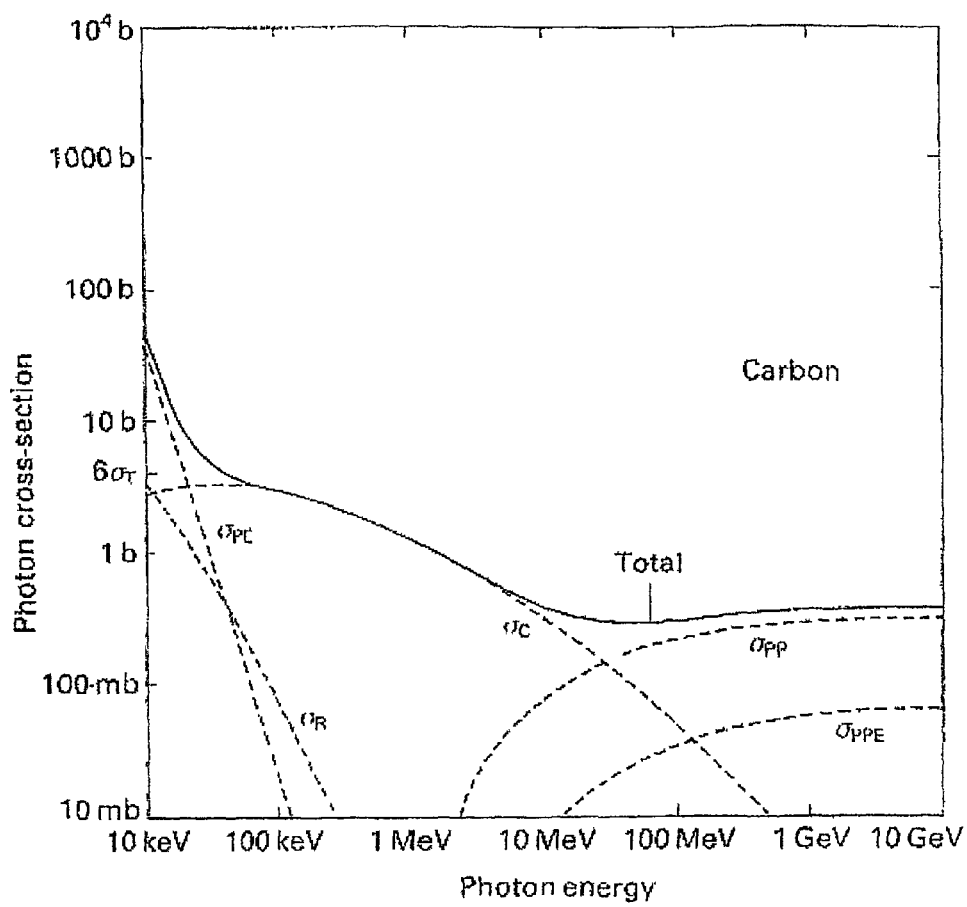
Subscripts on cross sections (σ) mean: PE = Photoelectric Effect; PP = pair production; PPE = pair production in the electric field of Z electrons; C = incoherent Compton scattering; R = Rayleigh scattering; PN = photonuclear cross-section Figure 8. High-energy photon absorption cross sections versus photon energy for Lead
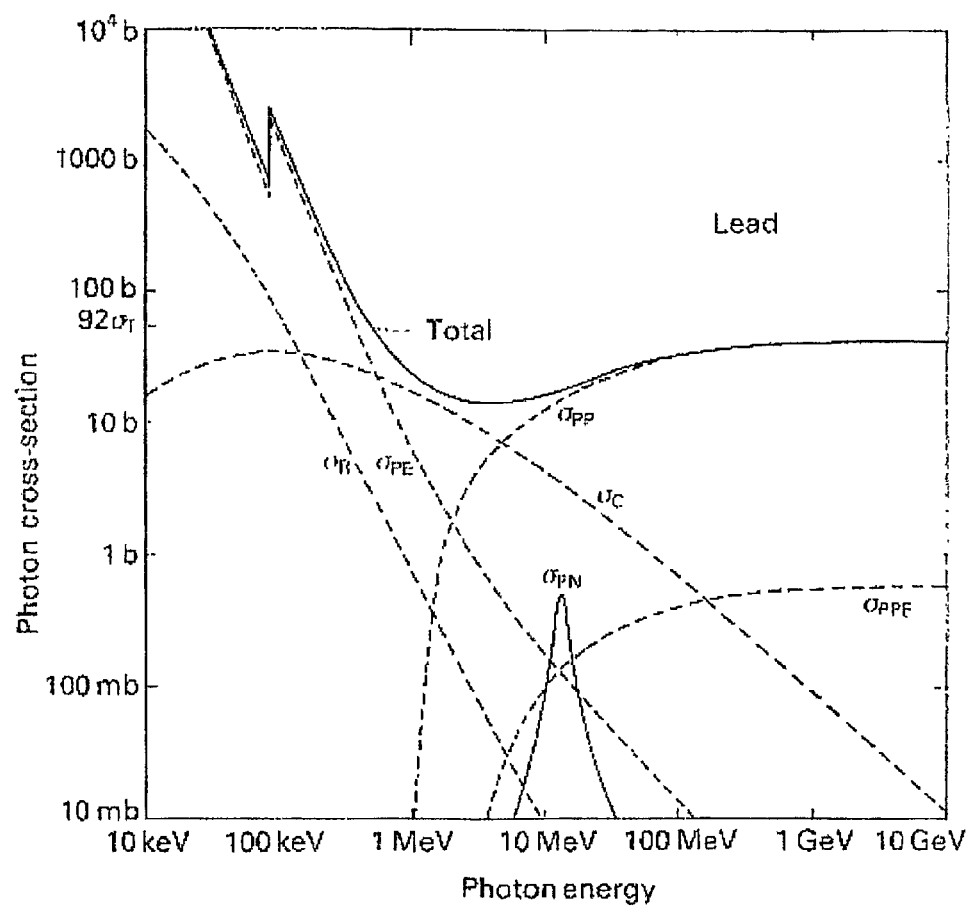
Subscripts on cross sections (σ) mean: PE = Photoelectric Effect; PP = pair production; PPE = pair production in the electric field of Z electrons; C = incoherent Compton scattering; R = Rayleigh scattering; PN = photonuclear cross-section Figure 9. Biological effects of different radiation found in the electromagnetic spectrum

| Types of Non-Ionizing and Ionizing Photon Radiation in the Electromagnetic Spectrum Effects on Biological Systems, including Higher Organisms | | | | |
|---|---|---|---|---|
| Type of Radiation | non-ionizing ──────────────────── ionizing ⟶ | | | |
| | extremely low frequency | radio ←→ microwave ←→ | infrared optical | ultraviolet x-ray gamma-rays ⟶ |
| Effects | non-thermal induces low currents ??? | thermal induces high currents heating | optical excites electrons photochemical effects | broken bonds damages DNA |

Figure 10. Ionization of an atom by interaction with high energy gamma photon
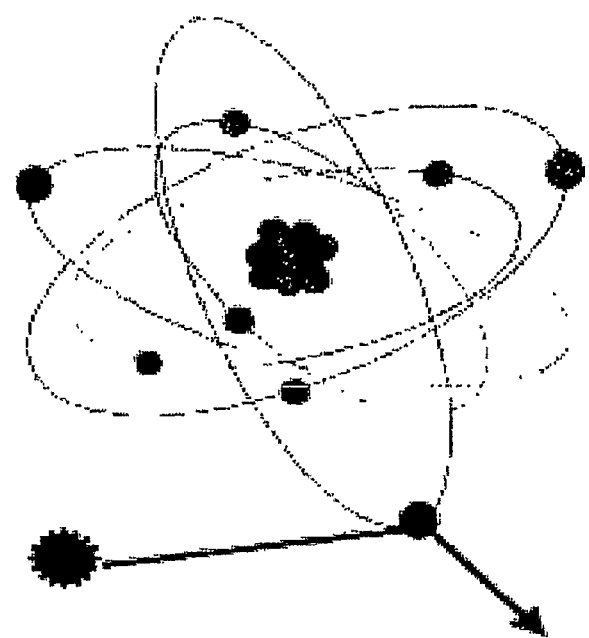
High Energy
Radiation > 30 eV
Electron is knocked off
making an ion pair Figure 11. Example of a gamma spectrum collected from a bentonitic clay soil on the Island of Cyprus
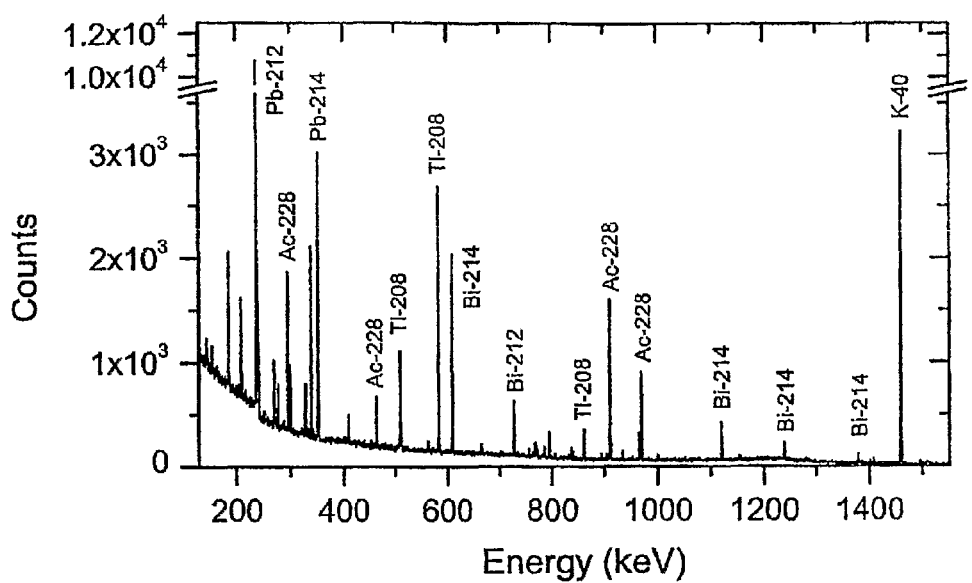

Figure 12. Example of a gamma spectrum collected from a soil found in rural Belgium (unshielded detector is situated right out in the open one meter above the ground surface)
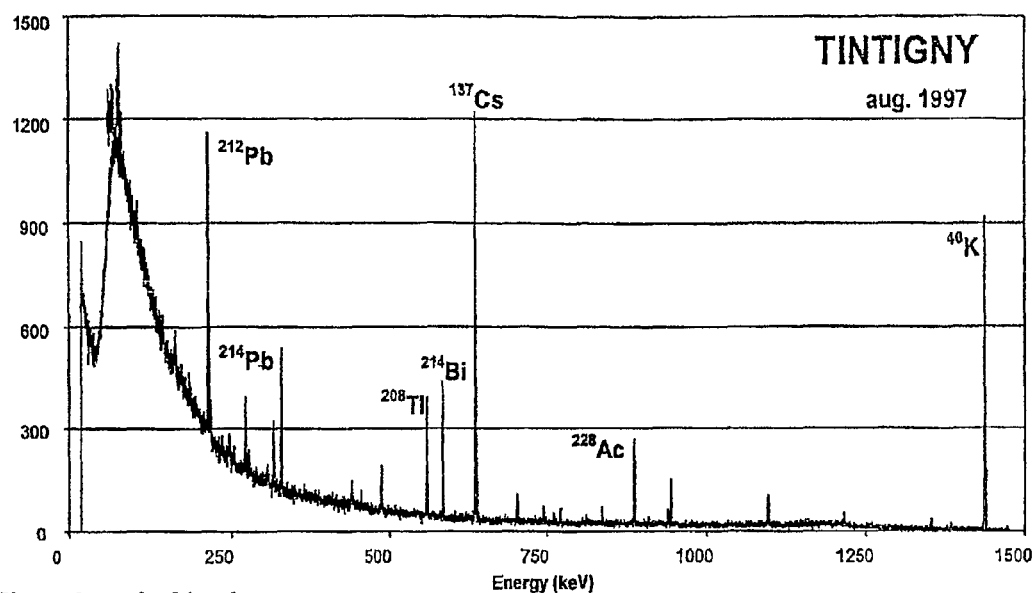
Figure 2: typical in-situ gamma-spectrum Figure 13. Gamma spectrum collected from sample of granite rock found near the Baltic Sea
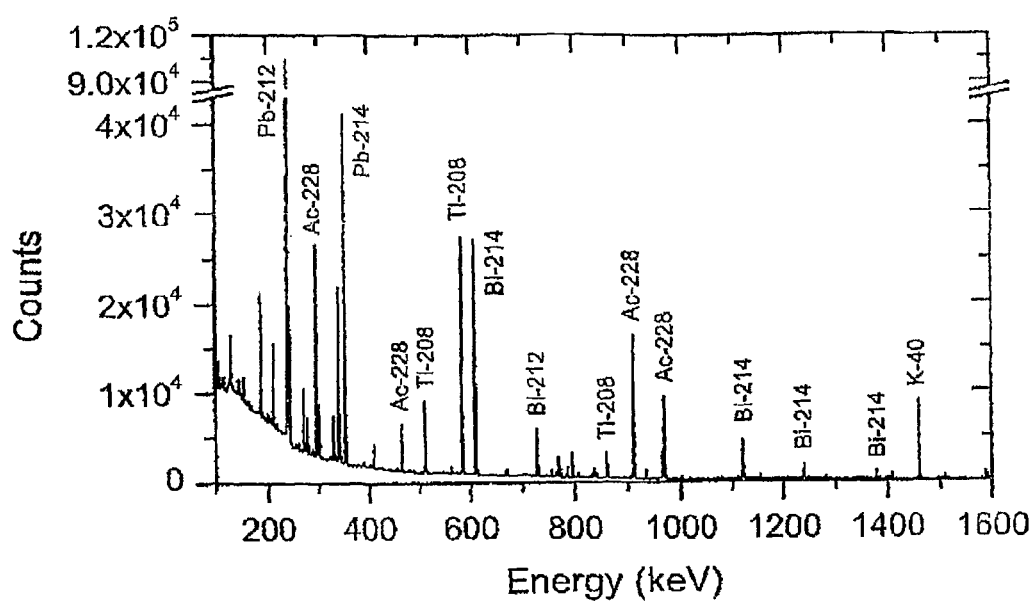

Figure 14. Background gamma spectrum collected inside a selected scientific laboratory
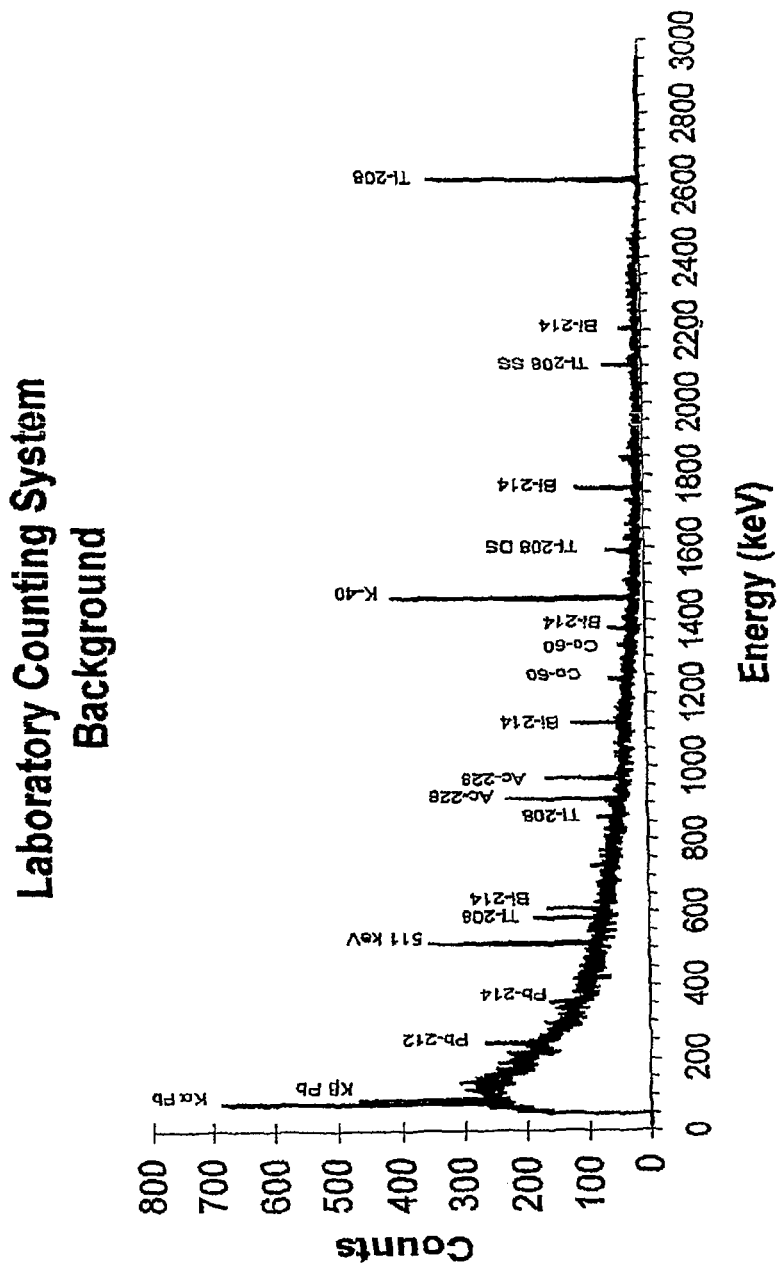

Figure 15. Delayed gamma spectrum collected from a Brazilian research reactor (IEA-R1)
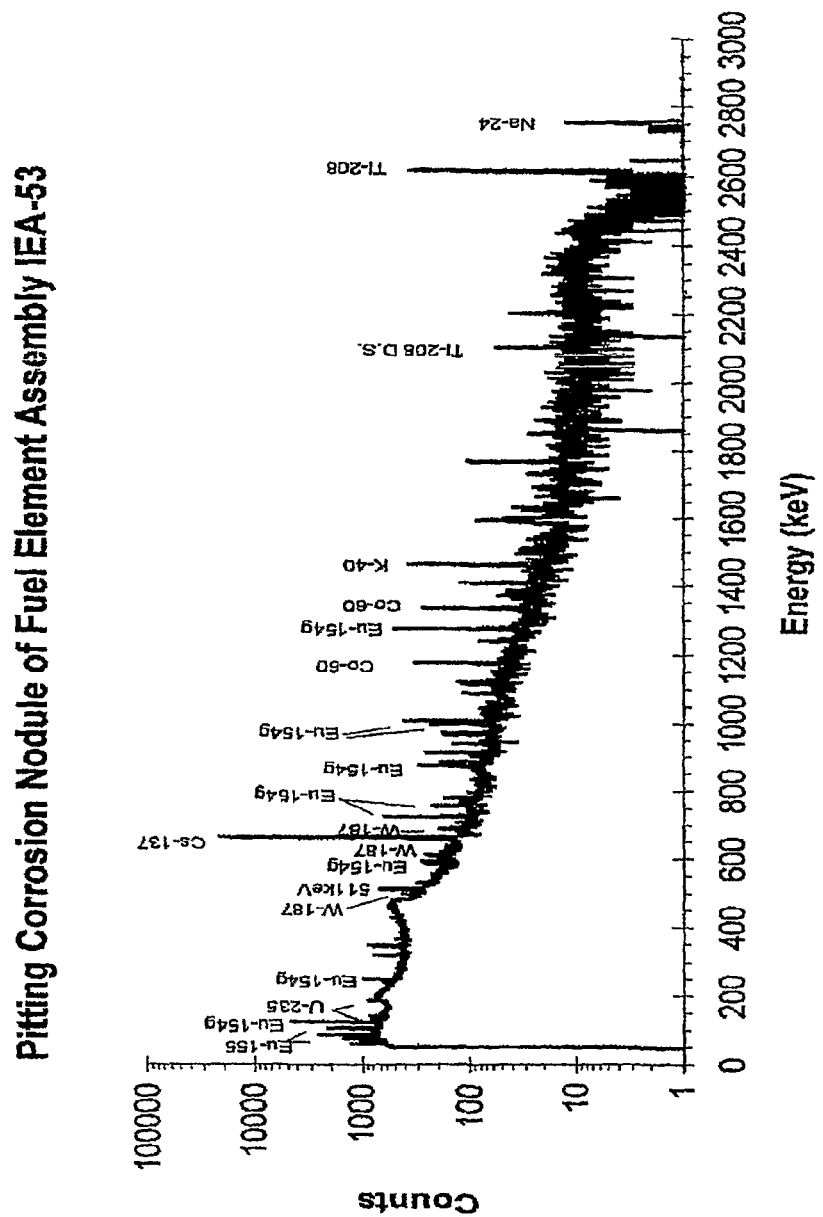

Figure 16. Thickness of one (1) half-value layer (measured in cm) of shielding as a function of incident gamma photon energy from 0.1 MeV up to 10.0 MeV
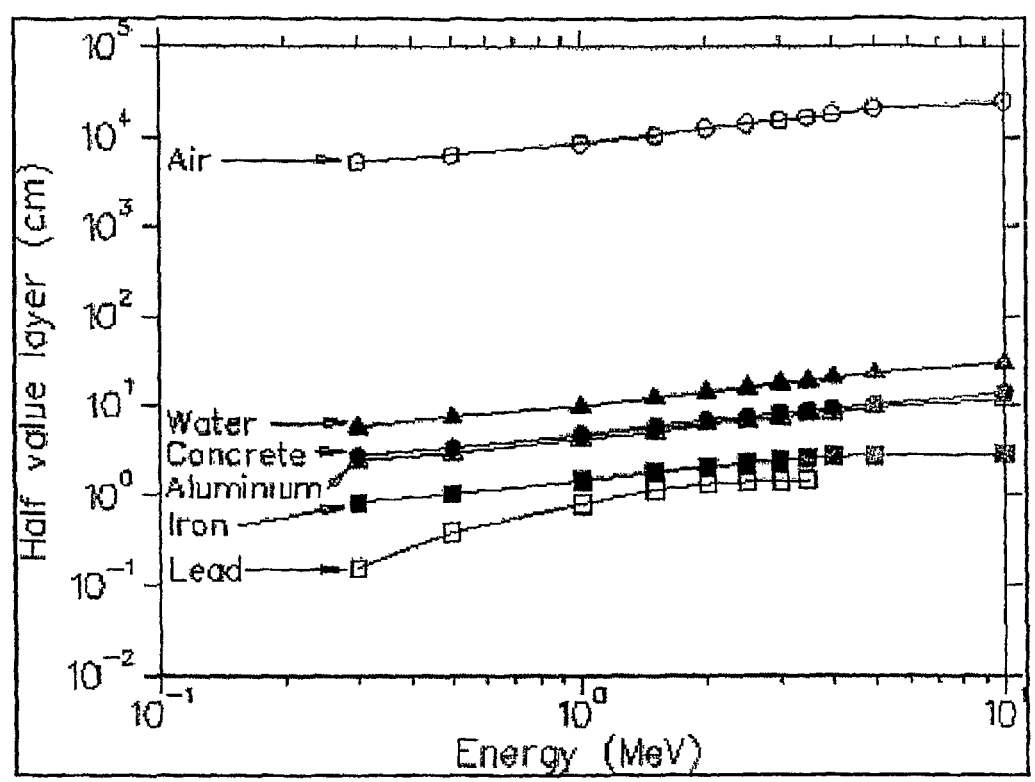

Figure 17. Reconstructed gamma spectrum from the Sarov criticality accident in 1997
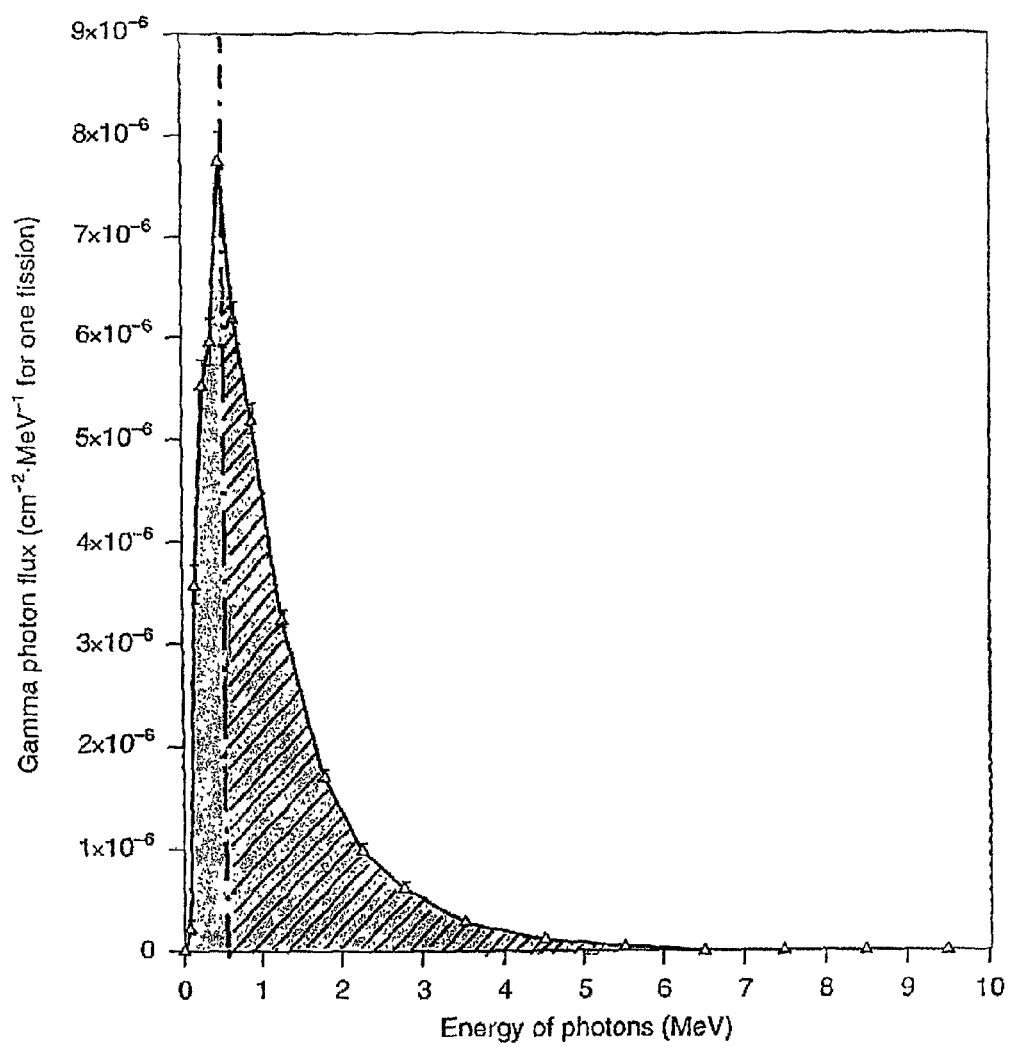

Figure 18. Schematic conceptual diagram showing absorption of a gamma photon by a heavy electron and re-radiation of the energy received from the gamma photon as a mixture of outgoing infrared and soft X-ray photons
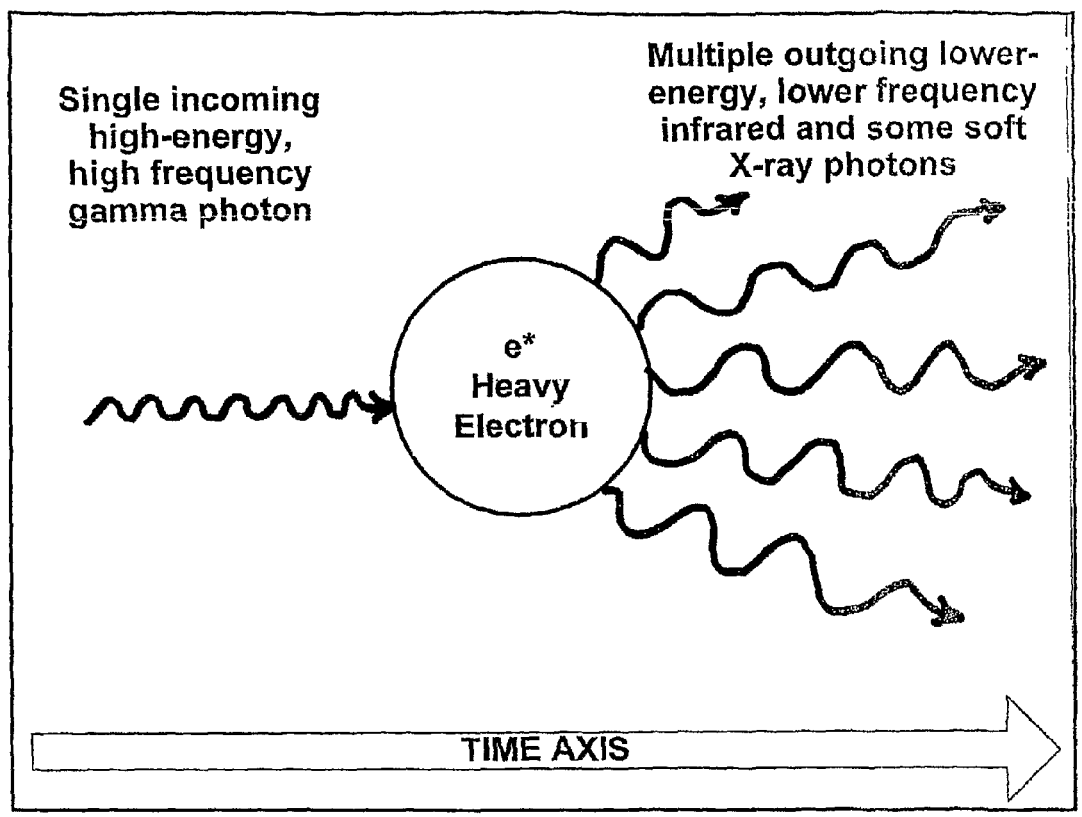

Figure 19. Conceptual overview of the invention
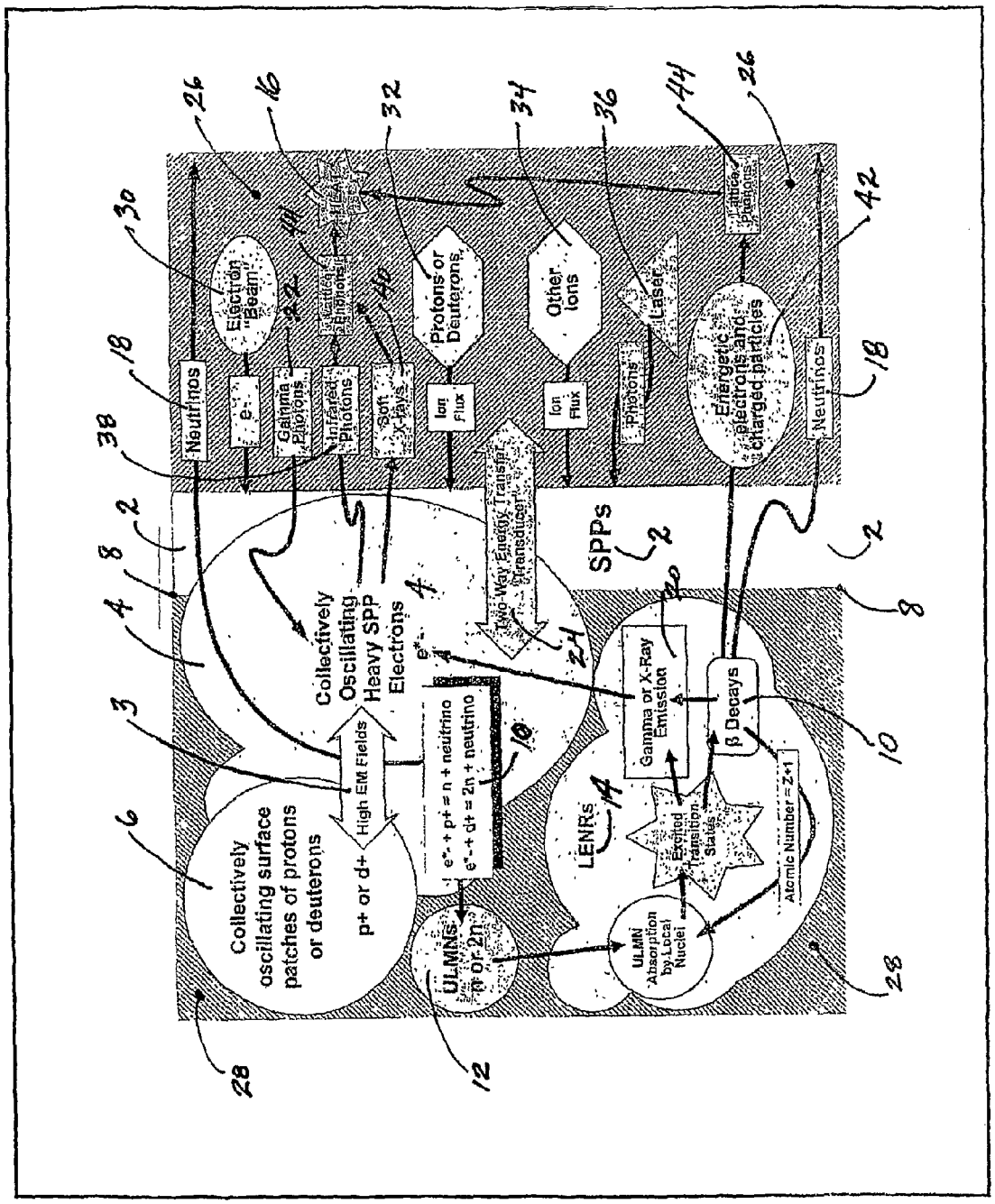

Figure 20. Side view of one embodiment of the invention.
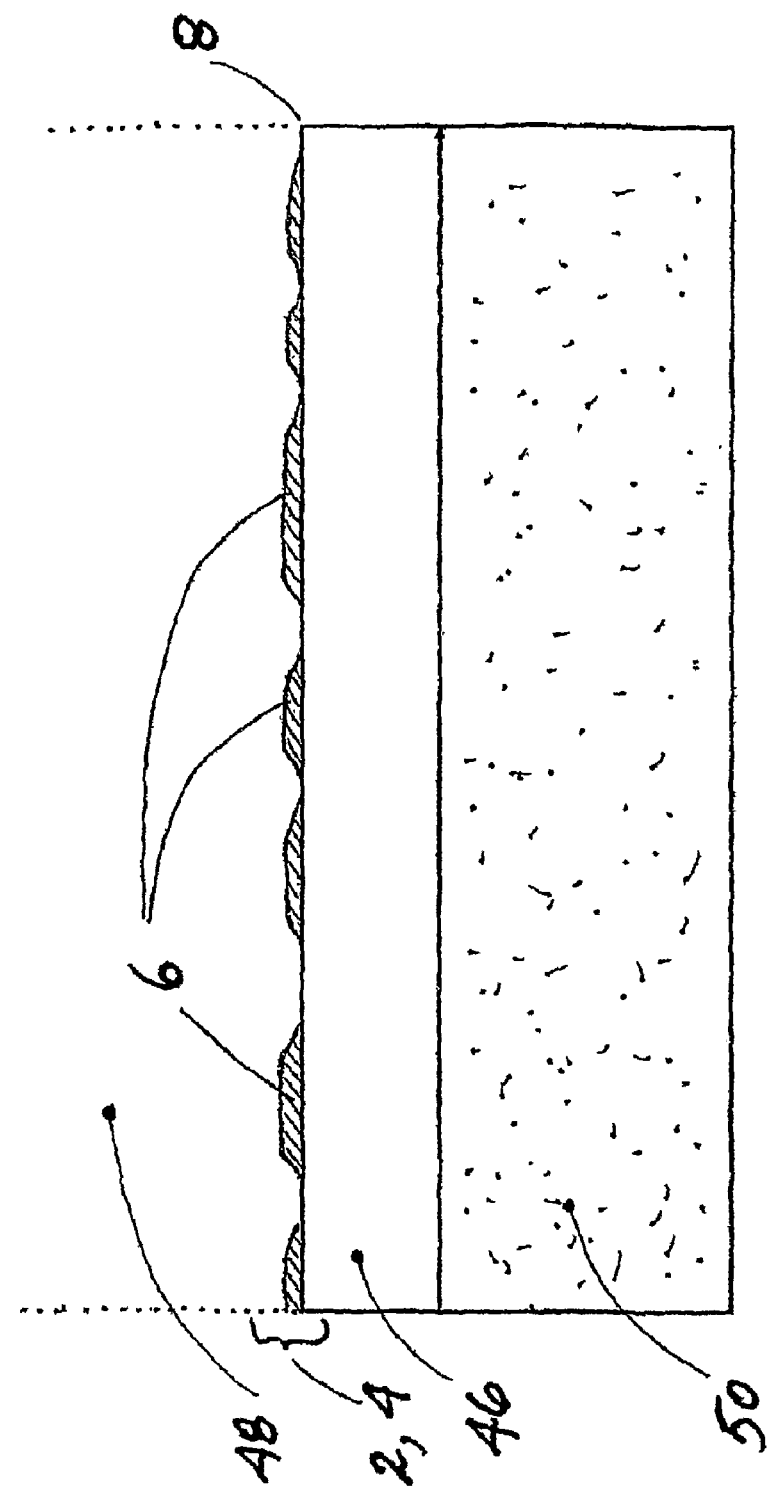

Figure 21. Top view of one embodiment of the invention
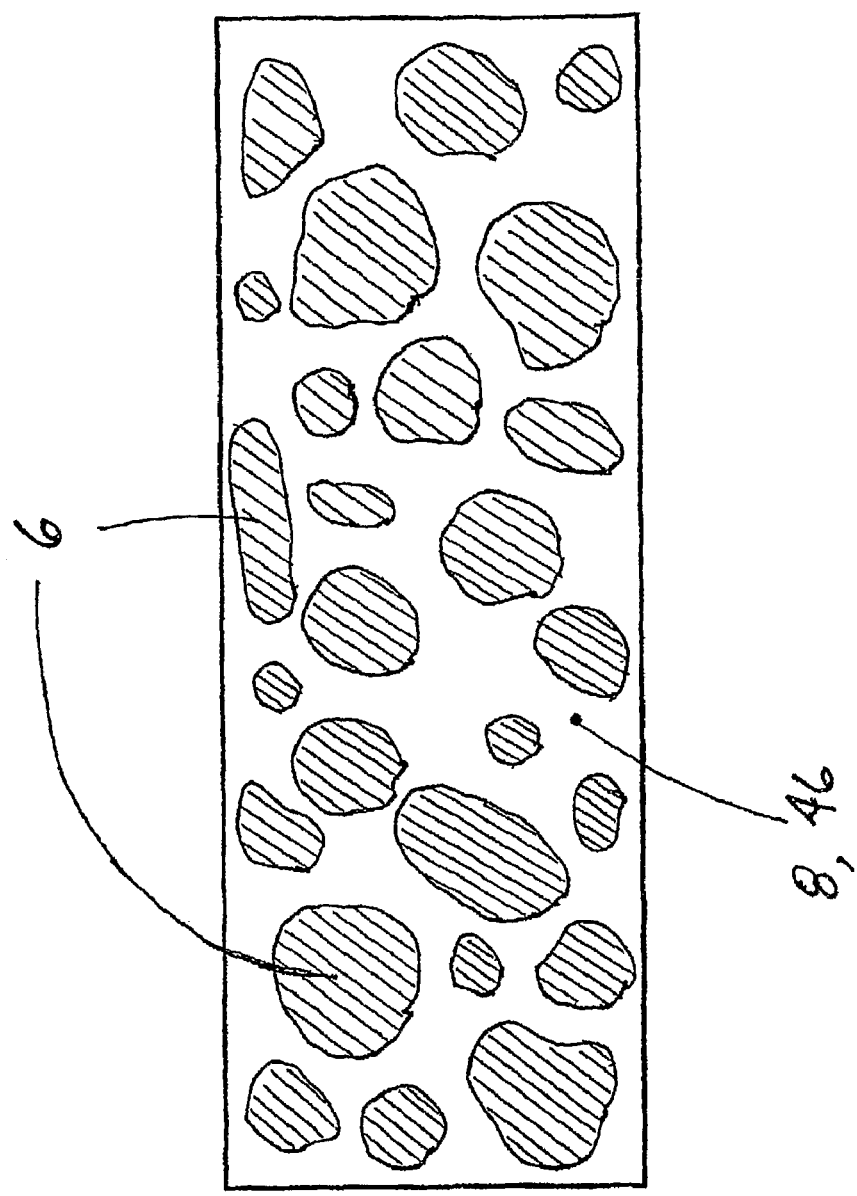

Figure 22. Side view of one embodiment of the invention with surface nanoparticles
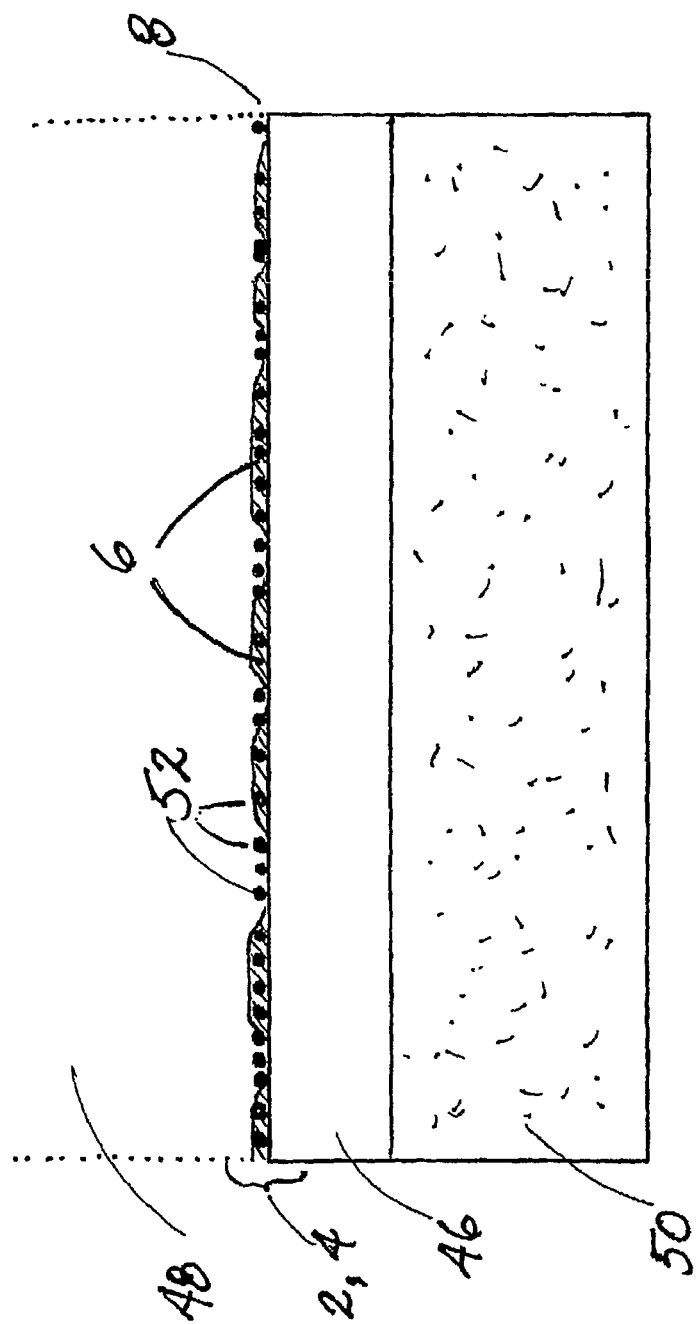

Figure 23. Top view of one embodiment of the invention with surface nanoparticles
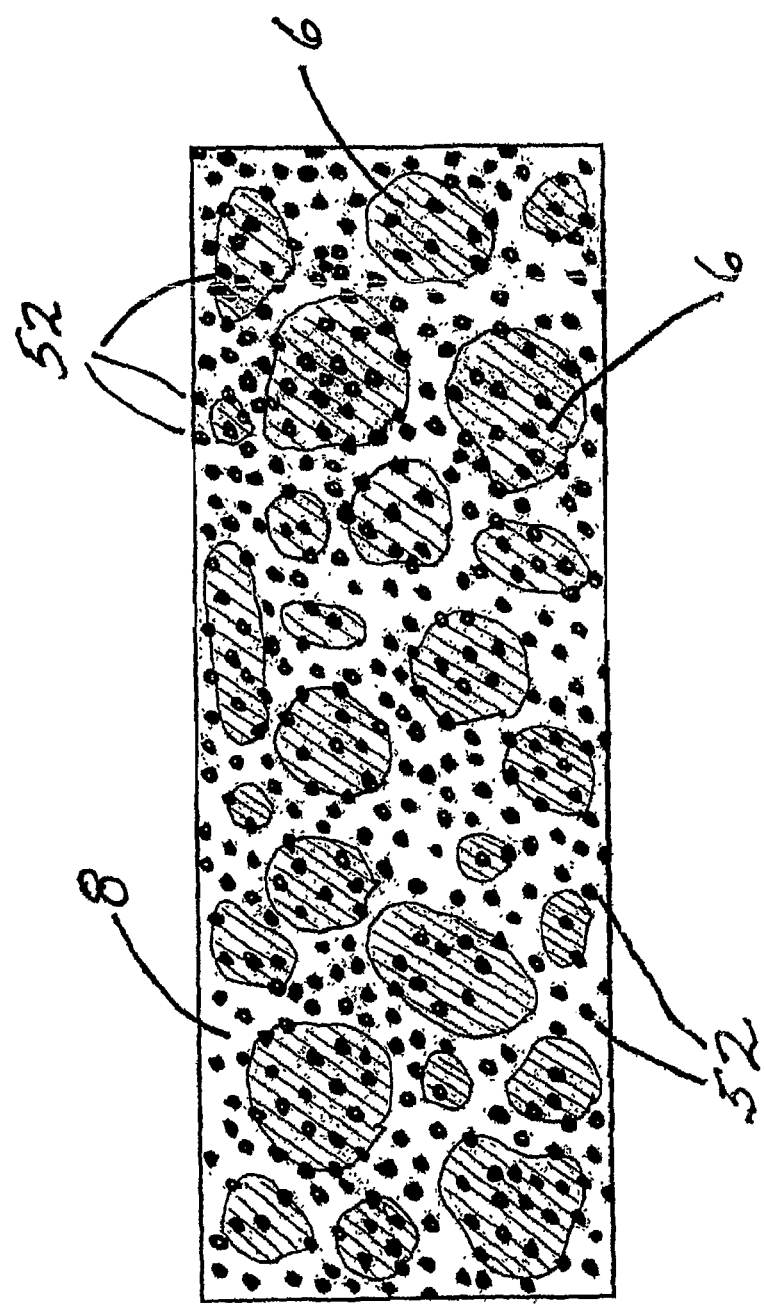

Figure 24. Schematic side view of one preferred embodiment of an ULM neutron generator system with integrated gamma shielding (not to scale)
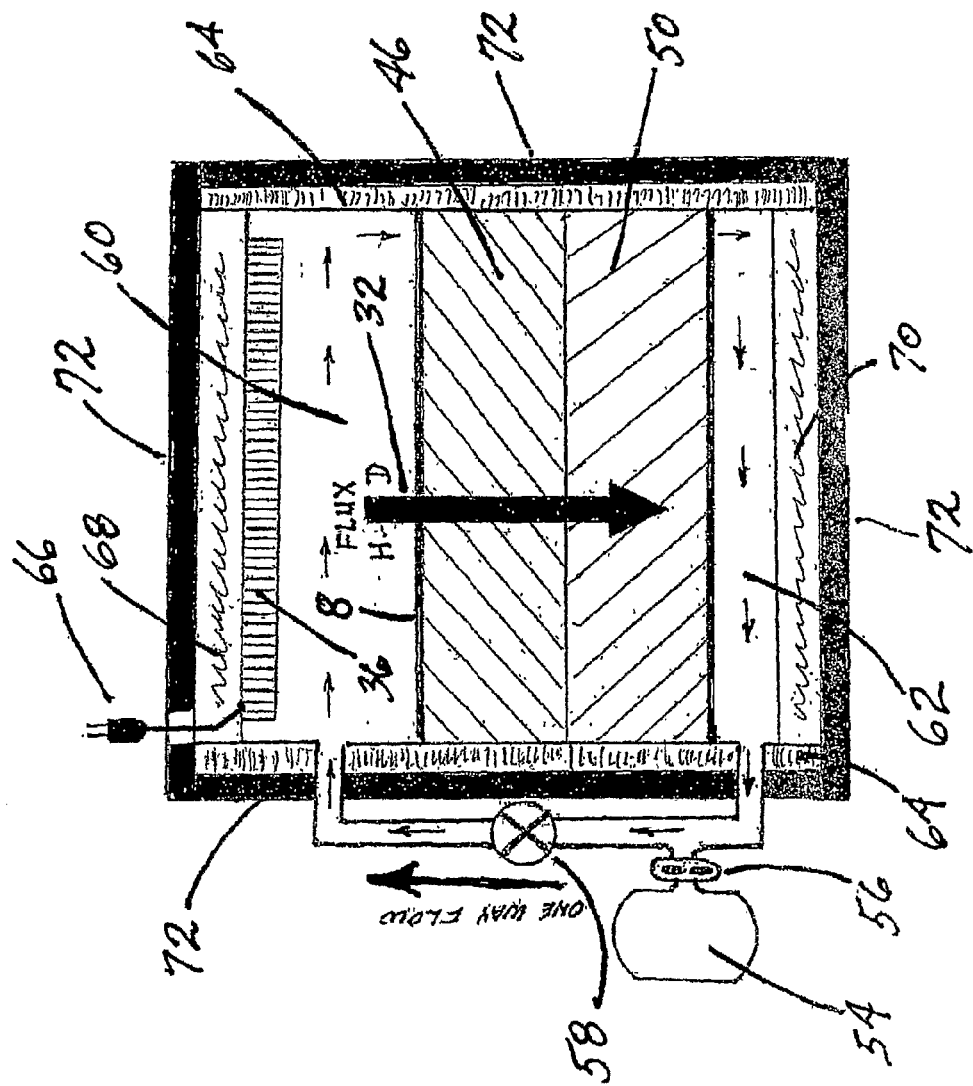

APPARATUS AND METHOD FOR ABSORPTION OF INCIDENT GAMMA RADIATION AND ITS CONVERSION TO OUTGOING RADIATION AT LESS PENETRATING, LOWER ENERGIES AND FREQUENCIES

Applicants claim the benefit of their Provisional patent application Ser. No. 60/715,622 filed in the United States Patent and Trademark Office on Sep. 9, 2005.

BACKGROUND OF THE INVENTION

The present invention concerns apparatus and methods for the shielding (absorption) of incident gamma radiation and its conversion to less energetic photons. Gamma photons (often denoted by the Greek letter gamma, γ) are a form of very high energy, very high frequency, very short wavelength, and very penetrating electromagnetic radiation emitted by, for example:

- Atomic nuclei making a transition from an initial excited nuclear state to a subsequent lower energy state, or
- Transmutation reactions (nuclear reactions in which one element changes to another) in which prompt gamma rays are emitted by an atomic nucleus after it has absorbed a type of neutral elementary particle called a neutron, or
- Radioactive decay of nuclei in processes such as fission of unstable radioactive isotopes (e.g. Uranium-235, used in nuclear weapons and some commercial nuclear power plants), and
- Other subatomic processes involving elementary particles such as electron-positron annihilation.

Gamma photons, alternatively called "gamma rays", "gamma radiation" or "gamma emissions", have the following basic characteristics:

- Energy: >100 keV
- Frequency: >$10^{20}$ Hz
- Wavelength: <$10^{-13}$ meters
- Penetrating Power: much more penetrating than X-rays in normal solid materials; gammas are the most powerful form of electromagnetic radiation.

The following terminology, consistent with accepted practice, will be used in this Invention:

- Infrared (IR)—associated with the concept of "heat" because it emitted as radiation by hot objects; efficiently absorbed by many solid materials. IR is a broad spectral segment; photon energies range from 0.0012 eV up to ~1.65 eV; this includes the infrared, intermediate infrared, and far infrared bands.
- Visible Light—electromagnetic radiation seen by the human eye comprises a relatively narrow slice on the entire electromagnetic spectrum with photon energies that range from 1.65 to 3.1 eV.
- Ultraviolet (UV)—broadly defined, photon energies range from 3.1 to 124 eV.
- Extreme Ultraviolet (EUV)—in optical and laser work, this term commonly refers to photons with energies that range from roughly 89 eV up to about 113 eV. This range narrowly overlaps the lower boundary of soft x-rays.
- Soft X-Rays—photon energy ranges from 0.10 keV (100 eV) up to 10 keV
- Hard X-Rays—photon energy ranges from 10 keV up to 1,000 keV (1 MeV)
- Gamma Rays—generally refers to any electromagnetic photon with an energy>100 keV; please note that this accepted definition overlaps that of "hard X-rays" from 100 keV to 1,000 keV (1 MeV)—this overlap is alternatively called "Soft Gamma Rays". In the narrowest possible definition, the energy of gamma ray photons ranges from 1 MeV up to whatever. Gamma photon energies can get extremely high: gamma rays emitted in a 1996 burst recorded from an astronomical object named Markarian 421 (known as a "blazar") reached 300 GeV—astronomers believe that they can reach TeVs.
- Prompt or Activation Gamma Rays—these terms imply gamma rays that are emitted from an atomic nucleus either: (a.) within one (1) nanosecond after a neutron absorption ("capture") event, or (b.) within a few nanoseconds after the instant of nuclear fission. Gammas arising from neutron captures on nuclei can be described either as "prompt gammas" or as "activation gammas". Gammas that are emitted contemporaneously with fission events are typically referred to as "prompt gammas."
- Delayed or Decay Gamma Rays—in the case of neutron capture on nuclei without inducing fission, the terms "delayed" or "decay" gamma rays generally imply gammas that arise in the course of subsequent decay of more neutron-rich, unstable product(s) that are produced by the initial neutron capture event. Analogously, in the case of a fission event (whatever the proximate cause), the terms "delayed" or "decay" gammas generally mean gammas that arise from the later (depending on their half-lives) radioactive decay of the fission product(s)/fragments.

The relative position and key characteristics of gamma rays compared to the rest of the electromagnetic spectrum can be seen in the following Table 1:

TABLE 1

Gamma Rays and the Electromagnetic Spectrum

| Name of Wave | Wavelength (m = meters) | Frequency (Hz) | Energy per Photon (eV) |
|---|---|---|---|
| AM Radio | $10^2$ | $10^6$ | $10^{-9}$ |
| FM, TV | 1 | $10^8$ | $10^{-7}$ |
| Radar | $10^{-1}$ | $10^9$ | $10^{-6}$ |
| Microwaves | $10^{-2}$ | $10^{10}$ | $10^{-5}$ |
| Infrared | $10^{-5}$ | $10^{13}$ | $10^{-2}$ |
| Visible Light | $10^{-7}$ | $10^{15}$ | 1 |
| Ultraviolet | $10^{-8}$ | $10^{16}$ | $10^1$ |
| X-Rays | $10^{-10}$ | $10^{18}$ | $10^3$ |
| Gamma Rays | $10^{-13}$ | $10^{21}$ | $10^6$ |

The data shown above in Table 1 is expressed graphically in FIG. 1 in which the relative positions of the infrared bands, soft X-rays, and soft/hard gamma rays are shown versus the entire electromagnetic spectrum.

FIG. 2 shows the relationship between gamma rays and the rest of the electromagnetic spectrum on the basis of wavelength; it also illustrates the relatively small percentage occupied by the visible segment of the entire spectrum.

Gamma photons interact with normal matter through three main processes (Photoelectric Effect, Compton Effect, and pair production); in order of increasing energy of incident gamma photons required to initiate them, they are as follows:

- Photoelectric Effect (gamma photon energy≦~0.5 MeV)—an incident gamma ray photon strikes and is fully absorbed by an atomic electron, which is then subsequently ejected from the atom as an energetic photoelectron, leaving an ionized atom. The gamma photon is now gone, having been absorbed completely by one atomic electron. This process is graphically illustrated in FIG. 3.

Compton Scattering (~0.5 MeV≦gamma photon energy≦~5.0 MeV)—in this process, an incident gamma ray photon strikes an atomic electron, ionizing it, and giving up part of its energy to the struck electron, which is then ejected from the atom as an energetic Compton electron. This process is graphically illustrated in FIG. 4. After scattering, the incident gamma photon, now at a lower level of energy, continues through the material or medium in which the atom on which it scattered was located. Depending upon its remaining energy, this lower-energy gamma photon may interact further with materials in its subsequent path via the Photoelectric Effect, Compton scattering, or pair production.

Pair Production (mostly at gamma photon energies≧~5.0 MeV)—in this process, an incident gamma ray photon makes it all the way through the outer cloud of atomic electrons and encounters the intense internal Coulomb field of a atomic nucleus. While in the grip of the nuclear Coulomb field, if an incident gamma photon's energy is greater than a minimum value of 1.022 MeV, pair production may occur. In this process shown in FIG. 5, the entire energy of an incident gamma photon (which then disappears) is converted into an electron-positron (positive electron) pair that fly-off in opposite directions. When such an emitted positron slows down and encounters an ordinary electron, they annihilate each other: two 0.511 MeV gamma photons are produced, which can subsequently interact with matter via the Photoelectric or the Compton Effect.

Relative contributions of each of process as a function of a "target" atom's nuclear charge (Z or atomic number of absorber) versus incident gamma photon energy (MeV) is shown in FIG. 6. In general, the Photoelectric Effect becomes dominant at low gamma ray energies. In the middle range of gamma ray energies from ~1-5 MeV, the Compton Effect dominates over the Photoelectric Effect and pair production. At very high energies, the Photoelectric Effect is absent and pair production increasingly dominates over the Compton Effect.

FIG. 7 illustrates high-energy photon absorption cross sections (measured in barns=b) versus photon energy for a relatively low-Z material (Carbon, Z=6); FIG. 8 shows the same data for a relatively dense, high-Z material (Lead, Z=82). Note the cross sections for absorption of gamma radiation between ~100 keV and 10 MeV for Carbon versus Lead.

In FIGS. 7 and 8, examination of the top line on the charted data denoting "Total" photon absorption cross-section per atom illustrates how a high-Z material (e.g. Lead) can be a substantially better gamma shield (i.e. photon absorber or attenuator) than a relatively low-Z material (e.g. Carbon) for gamma photons at energies from 100 keV to ~10 MeV. Implicit in this comparison is the fact that electron density is much higher in high-Z materials such as Lead than in low-Z materials such as Carbon.

It is important to note that in planetary environments, typical local (non stellar) gamma sources (natural, man-made, or man-induced) have photon energies that mostly range from 100 keV to ~10 MeV. Gammas produced in nuclear fusion processes can easily reach ~20+ MeV, but are rarely encountered on the surfaces of planets with atmospheres, including Earth. Thus, in most environments, the gamma photon energy range of ~0.5 MeV to ~10 MeV includes a very substantial portion of the gamma ray fluxes that might conceivably be encountered.

Gamma Photon Radiation Damages Biological Organisms and Modern Electronic Systems:

As shown in FIG. 9, exposure to electromagnetic (EM) radiation has various effects on biological and electronic systems. Compared to the rest of the EM spectrum, X- and gamma-rays can cause particularly severe, long term damage to various types of matter found in solid structures. Comparatively high potential for damage occurs from exposure to external gamma radiation because gamma photons have higher energy per photon, thus high frequencies, short wavelengths and tremendous penetrating power compared to charged particles such as alphas and betas (energetic electrons). X- and gamma-rays are thus able to ionize or otherwise excite a variety of atoms and/or molecules located almost anywhere deep inside a living organism or unshielded electronic component.

A simplified example of the process of ionization is illustrated in FIG. 10. What happens is that a high energy photon (anything>30 eV) first hits an electron of an atom located somewhere within a biological structure or electronic component. That impact can knock an electron out of the atom, leaving behind a positively charged atom (ion) and an energetic electron (together forming an "ion pair"), both of which can interact further with other local atoms or molecules; this is essentially what happens in both the Photoelectric Effect and Compton scattering (discussed earlier).

Types of Damage to Living Organisms from Incident Gamma Radiation:

The following illustrate various types of damage from exposure of unshielded living organisms to external gamma radiation; its penetrating power enables it to irradiate 100% of the materials comprising most organisms (99% are low-Z elements: H—60%; O—25%; C—12%; and N—5%):

Internal production of large quantities of highly reactive, damaging chemical species called "free radicals" that can wreak havoc in biochemical reaction networks by reacting extensively and uncontrollably with other molecules, Disruption of molecular chemical bonds resulting in "dangling bonds" and unnaturally activated macromolecules that can disrupt biochemical pathways, Production of new chemical bonds between nearby molecules, or creation of unnatural cross-linkages within various types of high molecular weight macromolecules, thus altering their biological function or biochemical activity, Deleterious alteration of the structures of biological macromolecules that are specifically involved in many critical cellular processes, e.g. proteins (structural and enzymes), RNA, and DNA.

Major Types of Damage to Modern Electronic Equipment from Gamma Radiation:

Similar to biological systems, many types of electronic equipment upon which modern civilization depends can be very sensitive to ionizing EM radiation (gammas and X-rays of terrestrial or extraterrestrial origin) and extremely energetic charged particles traveling at nearly the speed of light (cosmic rays of extraterrestrial origin of which 89% are protons, 10% are helium nuclei, and 1% are nuclei of many other elements) that are able to penetrate surrounding metallic enclosures.

Examples of essentially ubiquitous, potentially radiation-sensitive electronic components include microprocessors, computer memory chips, and many other types of integrated circuits that have micron- or sub-micron-sized features. Gamma radiation damage to modern electronic devices falls into two major categories: ionization effects and lattice displacements.

Damage to Electronics from Ionization Effects:

This is probably the most important class of damage created by irradiation of electronic components with gamma photons and/or hard X-rays. Key damage parameters include the total "dose" and energies of gamma photons, dose rate, and specific locations of ionization interactions within an electronic device.

Ionization-related damage can occur as a result of an interaction between a semiconductor device or integrated circuit's lattice atoms and a combination of atomic ions and energetic electrons (effectively beta particles) produced via the Photoelectric Effect and/or Compton scattering of gamma photons within device materials. Such secondary internal interactions between gamma photons and device materials (resulting from radiation passing through cases, circuit boards, components, and devices) are termed systems-generated electromagnetic pulse (SGEMP) effects.

Examples of several different types of gamma-induced ionization effects include

Photocurrents—Gamma irradiation can generate electron-hole pairs in semiconductor materials (a 1.0 MeV gamma photon can generate $10^5$ electron-hole pairs/photon); such free carriers generate photocurrents as they move through depletion regions of p-n junctions of integrated circuits. The size of these currents can be orders of magnitude greater than normal system levels and can cause temporary or permanent damage to electronic circuits, depending on specific circumstances. Both CMOS devices and MOSFET transistors are affected by photocurrents; free charge can be permanently trapped in certain oxide materials. In the extreme case of the nearby detonation of a nuclear weapon, large transient photocurrents can be created throughout the entire structure of irradiated semiconductors.

"Glitches" or Soft Errors—being short lived, these fall under the term "transient radiation effects in electronics" (TREE). They are transient, temporary effects that do not cause permanent damage to a device. In this effect, local charge fluctuations can cause transistors to randomly open which can in turn change the logical states of memory cells and flip-flops. Such "error states" are transitory, and disappear. In the case of DRAMs, the effects of such errors can be obviated with error-correction logic designed into the internal circuitry of the chip (ECC memory chips). However, depending on the size of the transient, this effect can also lead to permanent changes if there is actual junction burn-out or a "latch up".

"Latchup"—is a particularly destructive ionization effect that can potentially lead to catastrophic failure of electronic devices. This effect involves the creation of a high-current, low-voltage nanoscale pathway within an integrated circuit. Such an unnatural flow of current within a highly ordered device can cause a circuit to temporarily malfunction—in the worst case, a tiny segment of the device can be physically burned-out through joule heating of the material.

Damage to Electronics from Lattice Displacements:

This is a second major class of damage produced by gamma photons on electronic components; it occurs less frequently than ionization damage. Lattice displacement can only occur with relatively high-energy gamma photons which, for most materials and real-world environments, involve gamma photon energies from ~2 MeV to 10 MeV. This type of damage is produced when an atom in a semiconductor has a Compton scattering interaction with a gamma photon and the "target" atom is physically moved (displaced) from its normal position relative to neighboring atoms in the semiconductor's 3-D lattice structure. Such displacements can cause permanent physical changes in lattice structure (e.g. various types of structural defects) and drastically alter the properties of materials (e.g. changes in bandgap energy levels), depending upon the total "dose" and dose rate of gamma photons as well as the precise locations of resulting lattice defects.

Specialized Niche Markets for Radiation-Hardened Electronic Components:

Although small compared to the size of the global markets for commercial off-the-shelf (COTS) electronic components, there are specialized commercial markets for radiation-hardened (rad-hard) electronic devices. These markets serve primarily military customers with defense systems that must be able to operate either out in space and/or in combat environments in which nuclear or thermonuclear detonations can potentially occur. "Rad hard" integrated circuits and electronic systems for military and space applications are substantially more expensive than ordinary commercial products. Many of the essential features of this unique market segment are summarized in quotes from an employee of a company, Maxwell Technologies that is well known for its product lines of rad hard components and systems:

"The trouble is, building "hardened by design" electronics takes years, the costs are high, and at the end, the systems are often out of date with the current commercial state-of-the-art. Instead, there is an increasing need to use commercially-based computer systems in space to provide reliable, low power operation with throughput performance that is orders of magnitude higher than would be achievable with current state-of-the-art radiation-hardened flight systems."

"Traditionally, space-qualified single board computers (SBCs) have trailed the cutting-edge commercial and military products by factors of performance—often times in excess of 10-100×. Much of this discrepancy is due to the difficulty in radiation hardening, at either the component or system level, that is required for a product to survive and operate in the harsh environment of space."

"A simple and direct way to extend the life of semiconductors is to shield them against the ionizing dose environment. Electrons and protons can be shielded against relatively effectively, while energetic heavy ions and gamma radiation are difficult to shield against. Therefore, such an approach is attractive for space systems in which electrons and protons make ionizing dose a threat. While simple and direct, there is a science to shielding if one is to use it to the best advantage. The ability to use shielding is dependent on having enough information about the device to be shielded, as well as the intended environment."

"In addition to natural space radiation, some military systems must be protected from ionizing radiation from man-made sources in space, such as nuclear event-generated [nuclear weapons explosions] X-rays [and gamma rays]. Shielding can also prove to be very effective in reducing X-ray effects, depending on the energy of the photons. The problem of shielding against X-rays is somewhat different from that of shielding against the natural environment."

"The first such difference is found in the directionality of the radiation. Natural space radiation is, to a good approximation, omni-directional, while man-made radiation comes from a "point source," and is, therefore, highly directional. Simple slab shields are rather effective in dealing with omni-directional space radiation but are insufficient against X-rays [and especially even higher energy gamma rays]. Because the source of radiation can't be predicted, the device must be shielded in all directions in order for shielding to be effective. Such distinctions must be made clear to users interested in using shielded packages to assure that, in the drive to switch to commercial components, users do not lose essential elements of radiation protection."

"Putting component- and system-level radiation strategies together allows using modern COTS processors such as the wildly popular PowerPC processor architecture from Apple, IBM and Motorola in space-based SBCs."

The source of the above quotes is a published article titled, "*An Integrated Approach with COTS Creates Rad-Tolerant Single Board Computer for Space*", Chad Thibodeau, Product Manager, Maxwell Technologies, *COTS Journal*, December 2003.

Natural Background of Terrestrial Gamma and Hard X-Ray Radiation:

Earth's thick atmosphere protects the planetary surface from most gamma radiation originating in space from various sources located outside the solar system. However, the surface of the earth and its environs have always experienced a small, natural flux of background gamma and hard X-ray radiation, most of it being produced by decay chains of various radioactive isotopes found naturally in the earth's crust. A few radioisotopes (e.g. $^{238}$U) have been around essentially since the planet's formation from the protosolar nebula ~4 billion years ago. Examples of commonly occurring, gamma-emitting radioisotopes with very different half-lives include:

Bismuth: $^{212}$Bi (half-life=~1 hour) in $^{228}$Th decay chain; and $^{214}$Bi (half-life=~20 minutes)

Lead: $^{212}$Pb (half-life=~11 hours) and $^{214}$Pb (half-life=~27 minutes) in $^{228}$Th decay chain Potassium: $^{40}$K (half-life=~1.3 billion years) distribution is ubiquitous; can be found in bananas Thallium: $^{208}$Tl (half-life=~3 minutes) in thorium-228 ($^{228}$Th) decay chain Uranium: $^{238}$U (half-life=~4.5 billion years) weakly radioactive; found in depleted uranium munitions used by the military FIGS. 11, 12, 13, and 14 illustrate examples of fairly typical background gamma radiation spectra collected at different locations on the earth's surface, outdoors as well as inside a building structure housing a scientific laboratory. Please note that certain gamma lines in these spectra come from man-made "contaminant" radioisotopes, e.g. $^{60}$Co (Cobalt-60, which has a half-life of ~5.3 years) and $^{137}$Cs (Cesium-137 which has a prominent spectral "line" at an energy of ~660 keV and half-life of about 33 years). The $^{137}$Cs line is particularly prominent in FIG. 12 (a soil sample taken from rural Belgium). Thanks to previous nuclear weapons testing in the atmosphere up until the test ban treaty, ongoing commercial reprocessing of spent nuclear reactor fuel in some countries and the Chernobyl nuclear reactor disaster in Russia in 1986, $^{137}$Cs temporarily enjoys a nearly ubiquitous distribution across the earth's surface.

Nuclear Weapons, the Nuclear Power Industry, and Commercial Use of Gamma-Emitting Isotopes:

Beginning around the end of World War II, mankind's development and deployment of nuclear weapons (fission and fission-fusion) and closely related nuclear power generation technologies ushered in a new era in which radioisotopes that had been absent from the earth's surface for billions of years were suddenly being created and disseminated in terrestrial ecosystems.

Two atomic attacks on Japan, as well as subsequent nuclear weapons testing in the atmosphere from Jul. 16, 1945 to Nov. 4, 1962 (when atmospheric testing was finally banned) by a number of countries, injected a wide variety of gamma-emitting radioactive isotopes into the earth's environment. Parallel development of civilian nuclear power industries in many countries, along with intimately related fuel production/reprocessing and waste disposal activities, has resulted in further injections of radionuclides into global ecosystems. This includes thousands of low-level unintended releases, as well as the major disaster at the Chernobyl reactor complex in Russia in 1986. Also, a variety radioisotopes produced in nuclear reactors (e.g. $^{60}$Co) began to be used commercially as radiation sources in many industrial and medical applications, creating additional human exposure and used equipment disposal issues.

Existing nuclear fission and fission-fusion weapons characteristically produce a short, very intense flash of gammas and hard X-ray radiation that is closely associated with the explosive event. Weapon detonation creates a radiation "point source" that produces an initial burst of prompt<10 MeV gammas and 2 keV-500 keV X-rays (both inside a pulsewidth<<<100 nanoseconds) rapidly followed by a second, more drawn-out burst of delayed gamma photons (this second flux of photon radiation lasts from 100 nanoseconds to 10 milliseconds) at various energies ranging up to a maximum of ~10 MeV. This initial burst of electromagnetic radiation comprises roughly 5% of the total yield of a conventional nuclear explosion.

Globally, civilian and government-operated nuclear reactors are primarily used for electric power generation and to a much lesser extent for commercial production of various isotopes. Not surprisingly, the "fuel" rods used various types of modern commercial power reactors contain many of the same fissile isotopes that are found in nuclear weapons. Similarly, nuclear fission reactions occurring in power reactors also produce a mixture of both prompt and delayed gamma rays. Like weapons, energies of gammas and hard X-ray photons produced in power reactors range from 100 keV to ~10 MeV. However, by contrast, nuclear reaction rates in commercial reactors are tightly controlled, and thus produce a more-or-less continuous flux of gamma radiation, unlike the time-compressed, very intense bursts associated with nuclear weapons.

Since size or weight does not particularly matter in commercial nuclear reactors, shielding against various types of radiation, including gammas, can be massive and extensive. However, delayed gamma radiation emanating from radio-isotopes found in spent reactor fuel rods presents a more problematic safety issue than nuclear reactors themselves, since the rods must be physically removed from heavily shielded reactors after their use. Typically, such spent fuel rods and fuel assemblies are "temporarily" stored outside reactor buildings in secure, water-filled "cooling ponds"

while awaiting transport for disposal in high-level waste facilities such as the proposed site in Yucca Mountain, Nev., or alternatively in Europe, transport to nuclear fuel reprocessing centers.

FIG. 15 illustrates a delayed gamma spectrum collected from a spent nuclear reactor fuel assembly removed after many hours of operation inside a reactor core. The fuel assembly from which this particular gamma spectrum was collected came from an enriched uranium fueled, pool-type, light-water moderated Brazilian research reactor named IEA-R1. Similar to some of the other gamma spectra, FIG. 15 shows a prominent $^{137}$Cs line. FIG. 15 differs from the gamma spectra illustrated in FIGS. 11-14 in that its spectrum is much "hotter", much more complex, and exhibits many more high-count gamma emission lines. FIG. 15 also differs from the previous Figures of gamma spectra in that: (a.) total count rates are substantially higher for more penetrating gammas with energies>1,000 keV (1.0 MeV), and (b.) the $^{137}$Cs line at 660 keV has total counts of ~20,000 as compared to only ~1,250 for soil found outdoors in Belgium.

Since WWII, there has been increasing industrial and medical use of various gamma emitting isotopes in the form of sealed radiation sources; each isotope so used produces certain characteristic "lines" in the gamma energy spectrum. Those most commonly used in commercially available equipment are: $^{60}$Co (Cobalt-60; half-life=5.3 years), $^{137}$Cs (Cesium-137; half-life=33 years), and less frequently, $^{99m}$Tc (metastable Technetium-99; a nuclear isomer; half-life=6 hours, after which it decays via gamma emission to $^{99}$Tc which has a half-life=212,000 years). Less commonly used gamma emitters include: $^{226}$Ra (Radon-226; half-life=1599 years), $^{192}$Ir (Iridium-192; half-life=74 days), and 85K (Krypton-85; half-life=10.7 years). Gamma emitting isotopes are currently used in a variety of wide-ranging commercial applications that include: irradiation of foodstuffs and postal mail to kill harmful microorganisms; medical uses such as various kinds of cancer therapies; and industrial materials characterization such as gauging of product thicknesses on high-speed production lines.

Over the past decade or so, there has been acrimonious scientific debate and little-publicized research funding by several different governments (including the United States, France, China, Russia, and probably even Japan) aimed toward the possibility of developing a new and very different type of tactical nuclear weapon. In a radical departure from the past, such weapons would not be based upon nuclear fission or fission-fusion reactions; they would be based on controlled (triggered) deexcitation (decay) of certain nuclei from metastable excited isotopic states called nuclear isomers.

Unlike other types of isotopes, nuclear isomers do not involve any change in the number of protons or neutrons in an atomic nucleus. Rather, they are an excited metastable or isomeric state of an atom caused by the excitation of a proton or neutron inside its nucleus. For an atom to decay from such a higher-energy isomeric state to a (more stable) lower-energy non-isomeric ground state, the excited proton or neutron in the nucleus requires a change in its spin in order to deexcite and release its excess energy. Such isomeric decays involve two types of transitions: (a.) emission of gamma photons; (b.) internal conversion in which the energy released is used to ionize the atom.

By convention, isomers of a particular atom are designated by a lower-case letter "m" in several types of equivalent representations (e.g. Co-58m, $^m$Co-58, or $^{58m}$Co). For atoms that have multiple distinct isotopic isomers, they can be labeled 2 m, 3 m, etc. Nuclear isomers are scattered throughout the entire ensemble of 2,000+ known isotopes of all the elements currently included in the periodic table. Most isomers are very unstable and decay very rapidly, radiating their excess energy within $10^{-12}$ seconds; isomers listed in online nuclear databases are restricted mainly to those which have half-lives of $10^{-9}$ seconds or more.

The only known "stable" isomer is $^{180m}$Ta (Tantalum-180m); it has a half-life of at least $10^{15}$ years, and may in fact be stable. When $^{180m}$Ta decays, it radiates hard X-rays. The $^{178m}$Hf (Hafnium-178m) isomer has a half-life of 31 years; importantly, it has the highest known excitation energy of any nuclear isomer as well as a reasonably long half-life. When a $^{178m}$Hf atom decays, it releases all of its excess energy as ~2.4 MeV of gamma radiation. If all of the atoms contained in one kilogram (~2.2 pounds) of pure $^{178m}$Hf could be triggered to decay at exactly the same time, it could release ~900 Mega-Joules of energy in an intense flash of nearly pure gamma radiation; this is equivalent to the energy released in an explosion of a quarter of a kiloton of TNT. With an isomer weapon, there would be no lingering radiation or radioactive fallout after detonation. Besides weapons-related applications, there have been recent discussions within the U.S. Department of Energy (DOE) and DARPA concerning the possibility of using nuclear isomers to develop new, ultra high-performance energy storage technologies.

Two key technological problems that must be solved to harness the potential power of nuclear isomers for both weapons and energy storage applications are: (a) triggering them efficiently in a manner that permits a net energy gain from the point of triggering through decay; and (b) triggering enormous numbers of isomer atoms to decay in unison at exactly the same time. For energy storage applications there is also a third major problem: efficiently absorbing and converting gamma radiation into some other form of energy that can be more readily utilized to do work. DOE convened a scientific panel to determine whether $^{178m}$Hf production was feasible; the panel answered yes, but at very high cost. To date, none of these problems have been solved. A thorough, nontechnical summary of the recent history and scientific controversy surrounding DARPA-DOE-sponsored nuclear isomer research can be found as follows:

"Scary things come in small packages"
Sharon Weinberger
*The Washington Post*, Sunday, Mar. 28, 2004, Page W15
http://www.washingtonpost.com/ac2/wp-dyn?pagename=article&contentId=A22099-2004Mar24&notFound=true The subject of the development of isomer weapons for the U.S. military has also been discussed at length in a recent book:

*Imaginary Weapons: A Journey through the Pentagon's Scientific Underworld*
Sharon Weinberger, Editor of *Defense Technology International*
Nation Books (an imprint of Avalon Publishing Group, New York)
2006-276 pp In that regard, for several years the U.S. Air Force quietly conducted preliminary exploratory research on concepts involving aerospace applications for nuclear isomers as follows, but USAF work in this area has been suspended pending resolution of the ongoing debate about triggering:

"*Analysis of the application of a triggered isomer heat exchanger as a replacement for the combustion chamber in an off the shelf turbojet*"

C. R. Hartsfield, Captain USAF
Master's Thesis: AFIT/GAE/ENY/01M-04 March 2001
Dept. of the Air Force, Air University, Air Force Institute of Technology, Wright-Patterson AFB, Ohio
"*Design study of triggered isomer heat exchanger-combustion hybrid jet engine for high altitude flight*"
C. E. Hamilton, Captain USAF
Master's Thesis: AFIT/GAE/ENY/02-6 March 2002
Dept. of the Air Force, Air University, Air Force Institute of Technology, Wright-Patterson AFB, Ohio
"*Isomer Energy Source in Hybrid Jet Engines for High Altitude Reconnaissance Flight*"
C. Hamilton, P. King, and M. Franke (USAF Institute of Technology) *Journal of Aircraft* (0021-8669), 41, No. 1, January-February 2004, pp. 151-155
"*Isomer energy source for space propulsion systems*"
B. L. Johnson, Captain USAF
Master's Thesis: AFIT/GAE/ENY/04-M101 March 2004
Dept. of the Air Force, Air University, Air Force Institute of Technology, Wright-Patterson AFB, Ohio
"*Isomer heat exchanger combustor replacement for a supersonic ramjet powered vehicle*"
J. C. Cox, Ensign USNR
Master's Thesis: AFIT/GAE/ENY/04-J02 June 2004
Dept. of the Air Force, Air University, Air Force Institute of Technology, Wright-Patterson AFB, Ohio With the foregoing hypothetical aerospace applications, assuming that net-gain isomer triggering can be made to work, there is one additional major technological issue: low-mass materials that can provide critical, "mass-effective" shielding against gamma radiation.

Today, there is still heated scientific debate as to whether energy-efficient net-gain triggering of nuclear isomers is possible. Earlier experimental work by Prof. Carl Collins (Director, Center for Quantum Electronics, University of Texas at Dallas) et al. suggested that net-gain isomer triggering might be possible using much lower-energy X-rays. However, their work has not been replicated by others and, in the opinion of some scientists, has been totally discredited. Nonetheless, a number of researchers have continued experimental and theoretical work in this poorly understood area. For example, the following recent theory paper lends support to the idea that net-gain triggering of the $^{178m}$Hf isomer may in fact be possible in certain circumstances. This paper also mentions that a threshold triggering energy of 1.1 MeV for the spin-9, 75 keV isomer in $^{180m}$Ta has been established. However, with an input energy of 1.1 MeV, i.e. 1,100 keV, and decay output energy of only 75 keV, there is no net energy gain from triggering $^{180m}$Ta:

"*Nuclear structure of $^{178}$Hf related to the spin-16, 31-year isomer*"
Y. Sun, A. Zhou, G. Long, E. Zhao, and P. Walker
*Physics Letters B*, 589, pp. 83-88, 2004

As of this writing, it has been unofficially confirmed in 2006 that an experiment was recently conducted at a national DOE nuclear laboratory that reportedly demonstrated statistically significant acceleration of $^{178m}$Hf decay with an X-ray trigger. No further details are available, nor has anything yet been published in the open scientific literature about these new results.

External Shielding Against Various Types of Incident Radiation:

As stated earlier, external shielding with various materials is one way to protect living organisms and sensitive electronic equipment from exposure to various types of energetic charged particles, neutrons, and penetrating electromagnetic radiation such as gammas and X-rays. For charged particles such as protons, alphas, betas at moderate energies, comparatively little shielding is required to absorb the radiation completely. The greatest danger from the vast majority of alpha and beta particles is not created by external exposure to them (since shielding against them is almost trivial), but rather when they are somehow transported or produced inside a living organism or a nonliving physical enclosure containing sensitive electronic components.

Examples of external shielding against selected types of incident radiation are as follows:

Alpha particles (positively charged helium nuclei)—stopped by one thickness of ordinary writing paper; everything except the most energetic alphas are generally stopped by the human skin (its thickness varies from ~0.5 mm or 0.02" on the eyelids to ~4.0 mm or 0.16" on the palms and soles of the feet).

Beta particles (negatively charged energetic electrons)—completely stopped by 1" of wood, or 0.25" of Plexiglas plastic; it takes a beta particle with energy>70 keV to fully penetrate human skin.

Protons (positively charged elementary particles)—are stopped completely by relatively modest thicknesses of mid-Z metals; for example, only 25 microns (~0.001") of copper (Cu; Z=29) will completely stop all protons with energies<2.5 MeV. About 25 mm (~1") of high-purity germanium (Ge; Z=32) will stop protons with energies up to ~100 MeV.

Neutrons (no charge; an elementary nuclear particle that is stable only inside of an atomic nucleus—its half-life as a free particle outside of a nucleus is only around 13 minutes, after which it beta decays into a proton, electron, and a neutrino)—absorbed more effectively by hydrogen rich (H; Z=1) materials. Examples include: water, paraffin wax, polyethylene, and/or concrete (17 atom % hydrogen). Unfortunately, many types of materials can be "activated" by neutron absorption and subsequently produce prompt or delayed gammas and radioactive isotopes as a result; thus, gamma shielding may also be required. Neutrons are particularly damaging to living organisms because of their being composed of a high percentage of hydrogen (~60%) associated with carbon-hydrogen bonds in biological molecules. Although uncharged like gamma photons, neutrons interact much more strongly with air than gamma rays; thus, air can help shield against neutrons over moderate distances, particularly if saturated with water vapor. Neutron shielding strategies typically employ either: (a) relatively large thicknesses (e.g. 12" to 36" or more) and massive amounts of low-cost hydrogenous materials such as concrete or water; or (b) lesser thicknesses and smaller masses of higher-cost hybrid materials containing "dopants" comprised of elements having high neutron absorption cross sections (e.g. silicone sheets containing 25% Boron [B; Z=5] by weight; concrete containing depleted uranium oxide [U; Z=92; trademarked "DUCRETE"], etc.) and reduced propensity to emit prompt or delayed gammas after neutron absorption.

X-rays and gamma rays (no charge; electromagnetic photons with zero mass)—only effectively absorbed or attenuated by substantial thicknesses of denser materials such as ordinary concrete and/or lesser thicknesses of comparatively higher-Z materials such as steel (Fe:

Z=26), lead (Pb: Z=82), tungsten (W; Z=74), or depleted uranium (U; Z=92) metal alloys. This will be discussed in more detail below.

In order to have shielding with a high overall safety-factor, land-based commercial nuclear power reactors now typically utilize a welded steel containment vessel with walls ~10" thick; this is in turn surrounded by a containment building having steel-reinforced concrete walls at least 2-3 feet thick. By contrast, a proposed nuclear reactor design for long-duration manned space missions, such as to Mars or Jupiter's moons, utilized much less massive borated polyethylene radiation shields ~three feet thick, primarily for shielding against prompt neutrons.

Attenuating (Shielding Against) Gamma Radiation:

Being electromagnetic radiation, gamma photons are attenuated exponentially; thus, it is not theoretically possible to design a shield that will stop 100% of all incident gamma radiation. As a result, gamma rays and hard X-rays are much more difficult to attenuate or shield against than charged particle radiation such as alphas or betas. Like neutrons, X-ray and gamma photons do not possess any charge. This absence of charge causes their level of interaction with normal matter to be reduced, which substantially increases their relative penetrating power compared to charged particles. Also, as gamma photon energies get higher, they are somewhat more difficult to attenuate; a 5 MeV gamma photon has more penetrating power than a 1 MeV gamma photon. When using readily available conventional materials, comparatively thick, heavy layers of steel, lead, tungsten alloys, depleted uranium, or conventional concrete are typically needed to effectively attenuate gamma radiation to acceptable levels. In general, as the density and/or thickness of a shielding material increases, the attenuation of incident gamma radiation by the material also increases. Generally speaking, the higher the atomic number (Z) of the shielding material, and/or the higher its density, the greater the degree of attenuation of gamma radiation.

Unlike the case with alphas, betas, and to a lesser extent neutrons, air is relatively transparent to gamma radiation and provides little or no shielding over distances that can range up to many hundreds of meters from intense, high-energy gamma sources.

The subject of attenuation of gamma and X-ray radiation utilizes two closely related concepts that are defined as follows:

Half-Value Layer (HVL)—is the thickness of any specified material necessary to reduce the intensity of an incident beam of gamma or X-ray photons to one-half (50%) of its original value. The thickness of the half-value layer for a specific material is a function of the energy of the incident gamma radiation and the elemental composition of the shielding material.

Tenth-Value Layer (TVL)—is the thickness of any specified material necessary to reduce the intensity of a beam of gamma or X-ray photons to one-tenth (10%) of its original value.

The following Table 2 illustrates thicknesses of one half-value and one tenth-value layer for selected materials and two gamma sources often used in medical and industrial applications:

TABLE 2

Approximate Thicknesses of One (1) Half-Value and One (1) Tenth-Value Layer for $^{60}$Co and $^{137}$Cs (measured in inches)

| Gamma Emitter | Gamma Photon Energy (MeV) | One (1) Half-Value Layer | | | One (1) Tenth-Value Layer | | |
|---|---|---|---|---|---|---|---|
| | | Lead | Steel | Ordinary Concrete | Lead | Steel | Ordinary Concrete |
| $^{60}$Co | 1.17; 1.33 | 0.47" | 0.83" | 2.6" | 1.6" | 2.7" | 8.2" |
| $^{137}$Cs | 0.662 | 0.28" | 0.63" | 1.9" | 0.83" | 2.1" | 6.2" |

Data Source: U.S. Dept. of Labor - OSHA

Depending upon budgetary cost constraints, allowable physical volume of shielding, and total allowable mass of shielding, desired levels of gamma attenuation can be achieved by selection of specific shielding materials and thicknesses. For example, if a thickness of a given shielding material reduces the gamma flux to one-half of the incident value (i.e., a "half-value layer"), then the thickness of three such layers will reduce the dose to one-eighth (½×½×½) the initial amount; similarly, three "tenth-value layers" will reduce the dose to $\frac{1}{1000}$ of the initial amount ($\frac{1}{10} \times \frac{1}{10} \times \frac{1}{10}$). Selected examples of "$\frac{1}{1,000}$ gamma shield" thicknesses are illustrated in Table 3 as follows:

TABLE 3

Approximate Thicknesses of Three (3) Tenth-Value Layers for $^{60}$Co and $^{137}$Cs Attenuation of Gamma Flux to 1/1000 of the Incident Radiation (measured in inches)

| Gamma Emitter | Gamma Photon Energy (MeV) | 3× One (1) Tenth-Value Layer | | |
|---|---|---|---|---|
| | | Lead | Steel | Ordinary Concrete |
| $^{60}$Co | 1.17; 1.33 | 4.8" | 8.1" | 24.6" |
| $^{137}$Cs | 0.662 | 2.5" | 6.3" | 18.6" |

Relatively low-cost, readily available shielding materials such as steel, brick, concrete, water, or even packed earth can function as very effective gamma attenuators. Used properly, they can be quite cost-effective and provide the same degree of gamma shielding as higher performance materials if used in appropriately greater thicknesses in applications in which the total mass of shielding and/or its thickness are not important issues. This is why land-based nuclear reactors use thick layers of steel and concrete for shielding and containment. It is also the reason why manned military aircraft that are potentially exposed to gamma ray flashes from nuclear detonations currently have no real gamma shielding for pilots and crews. Although the U.S. military would willingly pay for the high cost of gamma shielding, existing high performance shielding materials cannot provide an effective shield with a mass that is low enough for both gamma attenuation and combat aircraft performance requirements to be met. Table 4 illustrates the approximate thickness (measured in inches) of one (1) tenth-value layer and three (3) tenth-value layers for 0.5 MeV and 0.8 MeV gamma photons for selected lower-cost, readily available materials:

TABLE 4

Approximate Thicknesses of One (1) Tenth-Value Layer and Three (3) Tenth-Value Layers for Various Lower-Cost Materials Three (3) Tenth-Value Layers Attenuate Gamma Flux to 1/1000 of the Incident Radiation (measured in inches except where otherwise noted)

| Gamma Shielding Material | One (1) Tenth-Value Layer | | 3× One (1) Tenth-Value Layer | |
|---|---|---|---|---|
| | Gamma Photon Energy | | | |
| | 0.5 MeV | 0.8 MeV | 0.5 MeV | 0.8 MeV |
| Lead | 0.55" | 1.0" | 1.7" | 3.0" |
| Copper | 1.6" | 2.0" | 4.8" | 6.0" |
| Iron (steel) | 1.9" | 2.3" | 5.7" | 6.9" |
| Aluminum | 5.5" | 6.3" | 16.5" | 18.9" |
| Concrete | 5.9" | 7.1" | 17.7" | 21.3" |
| Packed Earth | 7.5" | 9.1" | 22.5" | 27.3" |
| Water | 13.8" | 15.8" | 41.4" | 47.4" |
| Air (measured in feet) | 951' | 1,115' | 2,853' | 3,345' |

Data Source: Radiation Protection Manual at TRIUMF by Peter Garnett and Lutz Moritz, which utilized material from the book, Radiation Protection, Point Lepreau Generating Station by J. U. Burnham; see http://www.triumf.ca/safety/rpt/intro.html FIG. 16 shows the thickness of one (1) half-value layer (measured in cm) of shielding as a function of incident gamma photon energy from 0.1 MeV up to 10.0 MeV for a shield composed of either air, water, concrete, aluminum, iron (steel), or lead.

In some applications, more costly, "high performance" shielding materials that have higher density and higher atomic numbers (e.g. lead or tungsten) may be preferable for use in gamma shields because less thickness and weight per square foot of shielding is required for them.

The following elements are known to be somewhat better performing gamma attenuators than lead: tantalum (Ta; Z=73), tungsten (W; Z=74), thorium (Th; Z=90; no stable isotopes—all are mildly radioactive, $^{232}$Th occurs naturally with half-life=1.4×10$^{10}$ years), and depleted Uranium (called "DU"; used in military munitions: mostly $^{238}$U, Z=92; it is mildly radioactive).

Since DU and thorium are both slightly radioactive, their use may be barred in certain commercial shielding applications because of environmental and human health safety issues. Costs of less controversial higher performance gamma shielding materials can vary greatly. For example: as of this writing, the spot lead price in London is currently ~$0.59/lb; the price of tungsten is now roughly $11.80/lb or ~20× the price of lead; and current contract prices for tantalum are roughly $40-$50/lb or ~68× to 85× the price of lead. At this time, lead is hard to surpass for cost-effectiveness in appropriate gamma shielding applications.

Gamma shielding requirements can be more demanding for applications involving persistent non-weapon physical environments in which very large numbers of neutron captures on various elements/isotopes are occurring. Such environments include:

Operating nuclear reactors (mostly thermal neutron captures),
"Target" materials exposed to various types of neutron beams (slow and fast neutron captures),
Containment vessels of proposed commercial versions of D-T fusion reactors (energetic neutrons produced as products of fusion reactions are captured by nearby materials), and
Surface and near-surface regions of highly-loaded hydrides or deuterides in which Low Energy Nuclear Reactions (LENRs) are catalyzed by Ultra Low Momentum Neutrons (ULMNs) captured on local nuclei. LENRs can be sustained over significant periods of time under specific types of non-equilibrium conditions satisfying certain key characteristics and parameters, such as a material's ability to support surface plasmon polaritons, high proton/deuteron flux across the surface, and so forth.

Shielding for such neutron-rich nuclear environments can potentially be more difficult because (depending upon the isotopic composition of the neutron absorbers) neutron capture events frequently result in the production of prompt gammas, which tend to have higher average photon energies than delayed gammas produced in common nuclear decay chains (in which excess energy, Q, can often be distributed across a greater number of reaction products over a longer period of time). As illustrated in Table 4, higher gamma photon energies confer greater penetrating power and require significantly thicker shielding, all other things being equal.

An excellent database providing data on neutron capture gammas is available online as follows: "*Database of Prompt Gamma Rays from Slow Neutron Capture for Elemental Analysis—Final report of a coordinated research project*"

R. B. Firestone et al.

International Atomic Energy Agency (IAEA), Vienna, Austria (2003)

Key sections/items found in the above prompt gamma ray database (which covers 395 normally abundant isotopes and nuclear isomers out of several thousand known isotopes) are as follows:

Table 7.3, pp. 94-158, "Adopted Prompt and Decay Gamma Rays from Thermal Neutron Capture for All Elements"—note especially that upon examination there are only three isotopes shown with gamma decay lines having energies>10.0 MeV as follows: $^3$He (20.520 MeV); $^{14}$N (10.829 MeV); and $^{77}$Se (10.496 MeV—see later note: the second highest-energy gamma line listed for $^{77}$Se is 9.883 MeV)

Table 7.4, pp. 159-177, "Energy-Ordered Table of Most Intense Thermal Neutron Capture Gamma Rays,"—note that in this Table, there are only three gamma lines>10.0 MeV are for: $^3$He (20.520 MeV); $^{14}$N (10.829 MeV); and $^{77}$Se (9.883 MeV—see note above; on $^{77}$Se, there is a discrepancy between Table 7.3 and Table 7.4)

An examination of Tables 7.3 and 7.4 from the above reference yields the following:

Except for the three isotopes noted above ($^3$He, $^{14}$N, and $^{77}$Se), virtually all of the other neutron capture gammas listed in the IAEA database have photon energies that fall below 10.0 MeV.

A high percentage of prompt gammas from slow neutron capture have energies that fall between 0.5 MeV and 10.0 MeV. Many of these have many multi-MeV spectral lines.

Neutron capture on a proton produces a deuteron plus a 2.24 MeV gamma

Neutron capture on deuterium produces a 6.250 MeV gamma

Neutron capture on $^3$He produces a 20.520 MeV gamma

There can be significant qualitative and quantitative differences between delayed gamma spectra of various isotopes and prompt (especially fission) gamma spectra. FIG. 17 illustrates an essentially "pure" prompt gamma spectrum resulting from a fissile isotope: the y-axis on the chart is gamma photon flux (cm$^{-2}$·MeV$^{-1}$ for one fission); the x-axis is photon energy in MeV. The data underlying this Figure was reconstructed from extensive data automatically collected during a serious criticality "gamma flash" incident triggered by a freak handling accident with a critical assembly consisting of a highly enriched uranium (HEU) core and predominantly copper reflector. The incident resulted in one fatality, occurred at the Nuclear Center, in Sarov, Russia, in 1997 and was investigated by the International Atomic Energy Agency.

For the purpose of discussing FIG. 17, highly enriched uranium (HEU) means $^{238}$U that has been enriched up to >20% $^{235}$U. HEU is used in nuclear weapons and some types of military reactors, not in civilian uranium-based power reactors, which use only 3%-5% $^{235}$U. $^{235}$U is a fissile isotope, which means that it can support a runaway chain reaction.

Quoting from the IAEA accident report, "... *a component from the upper reflector slipped from the technician's rubber gloved hand and fell into the lower part of the assembly, which ... contained the enriched uranium core. The point of criticality was exceeded, there was a flash of light and a wave of heat, and the lower part ... was ejected downward ...*"

In FIG. 17 it is obvious by visual inspection of the respective total areas under the curve that the total flux of gamma photons between 0.5 and 10.0 MeV is substantially larger than the total flux between 0 and 0.5 MeV. This is consistent with the inventors' qualitative observation with respect to the IAEA "*Database of Prompt Gamma Rays from Slow Neutron Capture for Elemental Analysis*" in the bulleted points noted above.

The prompt gamma spectrum illustrated in FIG. 17 comes mostly from the fission of $^{235}$U, and to a lesser extent from prompt gammas produced by fast neutron captures on $^{238}$U, copper ($^{63}$Cu and $^{65}$Cu), and whatever other elements happened to be present in the critical assembly's "predominantly copper" reflector. This spectrum is similar to what would be produced during the initial prompt gamma "flash" in the detonation of a typical uranium-based fission weapon.

SUMMARY OF THE INVENTION

The present invention includes both apparatus and method aspects. One invented method shields gamma radiation by producing a region of heavy electrons and receiving incident gamma radiation in the region. The heavy electrons absorb energy from the gamma radiation and re-radiate it as photons at a lower energy and frequency. Illustratively, the gamma radiation comprises gamma photons having energies in the range of about 0.5 MeV to about 10.0 MeV.

Preferably, the method includes providing surface plasmon polaritons and producing the heavy electrons in the surface plasmons polaritons. The method may also include providing multiple regions of collectively oscillating protons or deuterons with associated heavy electrons.

Another aspect of the method of shielding gamma radiation includes providing nanoparticles of a target material on a metallic surface capable of supporting surface plasmons. The region of heavy electrons is associated with that metallic surface.

A further aspect of the invented method of shielding gamma radiation includes inducing a breakdown in a Born-Oppenheimer approximation.

A further aspect of the invented method of shielding gamma radiation includes providing low energy nuclear reactions catalyzed by ultra low momentum neutrons within the region of heavy electrons.

In the invented method of shielding gamma radiation, preferably the step of providing a region of heavy electrons includes: (a) providing a metallic working surface capable of supporting surface plasmons and of forming a hydride or deuteride; (b) fully loading the metallic surface with H or D thereby to provide a surface layer of protons or deuterons capable of forming coherently oscillating patches; and (c) developing at least one patch of coherently or collectively oscillating protons or deuterons on the surface layer. Preferably this method includes breaking down the Born-Oppenheimer approximation on the upper working surface. In this method, the surface material may comprise palladium or a similar metal and/or alloy capable of forming a hydride or deuteride; and providing a plurality of target nanoparticles on said metallic working surface. The target nanoparticles may comprise a palladium-lithium alloy.

In practicing the invented method of shielding gamma radiation, one may also include the step of directing laser radiation to the working surface to stimulate and transfer energy into the surface plasmons.

Preferably, in the method of shielding gamma radiation, the H or D surface layer is fully loaded by one or more of an enforced chemical potential difference, an electrical current, or a pressure gradient.

A further aspect of the invented method of shielding gamma radiation may include forming ultra-low momentum neutrons ("ULMNs").

Another aspect of the present invention provides a method of controlling the rate of beta decay and altering the half-lives of neutrons and/or nuclei found in a near-surface region. This is achieved by the steps of producing a region of heavy electrons and ULMNs in the neighborhood of the beta-decaying neutrons or beta-decaying nuclei, thereby altering the local density of states. In this method, the beta decay may be for either a nucleus or a neutron.

Still another aspect of the present invention is directed to a method of nuclear power generation including the steps of producing ULMNs and catalyzing low energy nuclear reactions with the ULMNs. These reactions produce a net release of energy. The method shields against gamma radiation produced from neutron captures on target nuclei in a region including heavy electrons.

The method of power generation may include providing a plurality of protons or deuterons on a working surface of hydride/deuteride-forming materials; breaking down the Born-Oppenheimer approximation in patches on the working surface; producing heavy electrons in the immediate vicinity of coherently oscillating patches of protons and/or deuterons; and producing the ULMNs from the heavy electrons and the protons or deuterons. Preferably this method includes producing excess heat. Preferably the method also includes forming surface plasmon polaritons.

Another aspect of the present invention provides a gamma radiation shield comprising: a substrate; a metallic working surface capable of supporting surface plasmons and of forming a hydride or deuteride, located above said substrate; above the metallic surface, a surface layer of protons or deuterons comprising fully loaded H or D; at least one patch of collectively oscillating protons or deuterons associated with the surface layer; a region of surface plasmon polaritons located above the surface layer and the at least one patch; and a flux of protons or deuterons incident on the surface plasmon polaritons, surface layer, and working surface.

According to a further aspect of the gamma radiation shield, the surface material comprises palladium or a similar metal and/or alloy capable of forming a hydride or deuteride.

Another aspect of the gamma radiation shield includes laser radiation incident on the working surface to stimulate and transfer energy into the surface plasmon polaritons.

The gamma radiation shield may further comprise a plurality of target nanoparticles on the metallic working surface. Preferably the target nanoparticles comprise a palladium-lithium alloy.

In the gamma radiation shield, preferably the H or D surface layer is fully loaded by one or more of an enforced chemical potential difference, an electrical current, or a pressure gradient.

In the gamma radiation shield, preferably the at least one patch produces heavy electrons; and wherein said heavy electrons absorb gamma radiation. Gamma photons result from neutron capture or from an external source.

The present invention also provides a method of altering the rate of a nuclear reaction involving nuclear decay by substantially more than 5 to 10% comprising producing a region of heavy electrons and ULMNs in the neighborhood of the beta-decaying nucleus.

It will be appreciated that another aspect of present invention provides an apparatus for a nuclear reaction. The apparatus comprises: a supporting material; a thermally conductive layer; an electrically conductive layer in contact with at least a portion of the thermally conductive layer; a cavity within the supporting material and thermally conductive layer; a source of hydrogen or deuterium associated with the cavity; first and second metallic hydride-forming layers within the cavity; an interface between a surface of said first hydride-forming layer, the interface being exposed to hydrogen or deuterium from the source. A first region of the cavity is located on one side of the interface and has a first pressure of hydrogen or deuterium. A second region of the cavity is located on one side of the second hydride-forming layer and has a second pressure of the hydrogen or deuterium. The first pressure is greater than the second pressure. The apparatus forms a sea of surface plasmon polaritons and patches of collectively oscillating protons or deuterons, and ultra low momentum neutrons in a range of about 500 Angstroms both above and below the interface.

Preferably, in this apparatus for a nuclear reaction, a Fermi-level difference between the first and second layers is greater than or equal to about 0.5 eV.

The apparatus may further comprise a laser positioned to irradiate the sea of surface plasmon polaritons and the interface. According to another aspect, the apparatus may also include an electrically conductive layer forming a portion of an inside wall of the cavity.

BRIEF DESCRIPTION OF THE DRAWINGS

In describing the present invention and the background thereto, reference has been made and will be made to the following Figures wherein:

FIG. 1 represents the relative positions of infrared, X-ray, and gamma bands in the electromagnetic spectrum;

FIG. 2 shows the relative position of gamma rays in the electromagnetic spectrum;

FIG. 3 is a representative sketch concerning the photoelectric effect;

FIG. 4 is a representative sketch concerning Compton scattering;

FIG. 5 is a representative sketch concerning pair production;

FIG. 6 graphically illustrates the relative contributions of each of the processes of FIGS. 3 to 5 as a function of a "target" atom's nuclear charge (Z or atomic number of absorber) versus incident gamma photon energy (MeV) photoelectric effect;

FIG. 7 shows high-energy photon absorption cross sections versus photon energy for Carbon;

FIG. 8 shows High-energy photon absorption cross sections versus photon energy for Lead;

FIG. 9 shows biological effects of different radiation found in the electromagnetic spectrum;

FIG. 10 depicts the ionization of an atom by interaction with a high energy gamma photon;

FIG. 11 graphically illustrates a gamma spectrum collected from a bentonitic clay soil on the island of Cyprus;

FIG. 12 graphically illustrates a gamma spectrum collected from a soil found in rural Belgium (using an unshielded detector is situated one meter above the ground surface out in the open);

FIG. 13 graphically illustrates a gamma spectrum collected from a sample of granite rock found near the Baltic Sea;

FIG. 14 graphically illustrates a background gamma spectrum collected inside a selected scientific laboratory;

FIG. 15 graphically illustrates a delayed gamma spectrum collected from a Brazilian research reactor;

FIG. 16 shows the thickness of one half-value layer (measured in cm) of shielding as a function of incident gamma photon energy from 0.1 MeV up to 10.0 MeV;

FIG. 17 graphically illustrates a reconstructed gamma spectrum from the Sarov criticality accident in 1997;

FIG. 18 is a sketch that depicts the absorption of gamma photons by a heavy electron and re-radiation as infrared and soft X-ray photons;

FIG. 19 is a sketch useful in understanding various concepts of the present invention;

FIG. 20 represents a side view of a first apparatus according to aspects of the present invention;

FIG. 21 represents a top view of the apparatus of FIG. 20;

FIG. 22 represents a side view of apparatus according to aspects of the present invention with surface nanoparticles;

FIG. 23 represents a top view of the apparatus of FIG. 22; and

FIG. 24 is a schematic side view of a preferred embodiment of an ULM neutron generator system with integrated gamma shielding according to aspects of the present invention.

DETAILED DESCRIPTION

A. Scientific Aspects

The present invention's solution to the problem of gamma shielding is based on a novel utilization of heavy, mass-renormalized electrons. The invention's method and related apparatus can be used, for example, for nuclear power generation in conjunction with suppression of externally detectable gamma emissions through local absorption of prompt and delayed gamma photons by heavy electrons. Heavy electrons in the present invention absorb electromagnetic energy from incident gamma photons (arising from local low energy nuclear reactions or from other external sources) and reradiate it in the form of greater numbers of lower-frequency, less penetrating infrared and soft X-ray photons.

In conjunction with contemporaneous generation of large fluxes ultra low momentum neutrons and triggering of low energy nuclear reactions (LENRs), one related application of the present invention involves a method for creation of thin layers of the above described heavy electrons in condensed matter systems at moderate temperatures and pressures in various preferred types of very compact, low mass, comparatively low cost apparatus. Such apparatus can be utilized to create novel, low mass, low cost, highly effective shielding against gamma radiation. An aspect of the present invention is producing heavy electrons and using them to shield against gamma radiation, converting it to lower energy, lower frequency radiation. Such lower frequency radiation may comprise, for example, infrared and soft X-ray radiation as mentioned in the prior paragraph.

Heavy electrons utilized by this invention can be generated in condensed matter systems as described by Larsen and Widom in U.S. Patent Application No. 60/676,264 entitled, "APPARATUS AND METHOD FOR GENERATION OF ULTRA LOW MOMENTUM NEUTRONS" having a U.S. filing date of Apr. 29, 2005, which is hereby incorporated herein by reference in its entirety and a copy of which is physically attached hereto as Attachment 1, and/or incorporated into apparatus used to generate ultra low momentum neutrons (ULMNs) and subsequently use ULMNs to catalyze (via neutron capture on nearby materials) various types of low energy nuclear reactions (LENRs) as disclosed therein.

In connection with the above mentioned prior filing, a scientific paper written by Allan Widom and Lewis Larsen entitled, "*Ultra Low Momentum Neutron Catalyzed Nuclear Reactions on Metallic Hydride Surfaces*" was initially published on the arXiv Internet physics preprint server on May 2, 2005 (see http://arxiv.org/abs/cond-mat/0505026). That paper was subsequently published in the *European Physical Journal C—Particles and Fields*, 46, 107-111 (March 2006). It is hereby incorporated by reference and is intended to form part of this disclosure. A copy of the *EPJC* paper is actually included within Attachment 1. The paper's abstract states:

"Ultra low momentum neutron catalyzed nuclear reactions in metallic hydride system surfaces are discussed. Weak interaction catalysis initially occurs when neutrons (along with neutrinos) are produced from the protons that capture "heavy" electrons. Surface electron masses are shifted upwards by localized condensed matter electromagnetic fields. Condensed matter quantum electrodynamic processes may also shift the densities of final states, allowing an appreciable production of extremely low momentum neutrons, which are thereby efficiently absorbed by nearby nuclei. No Coulomb barriers exist for the weak interaction neutron production or other resulting catalytic processes."

While it is well known that strong force nuclear reactions can be used to generate neutrons, the present invention according to one of its aspects utilizes weak force interactions between protons ($p^+$) and "heavy" electrons ($e_h^-$) to produce a neutron ($n_{ulm}$) and a neutrino ($v_e$) as follows:

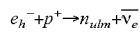
$$e_h^- + p^+ \rightarrow n_{ulm} + \overline{v}_e$$

The above-referenced paper by Widom and Larsen explains how, under the appropriate conditions, a proton is able to capture a "heavy" electron to create an ultra low momentum neutron ($n_{ulm}$) and a neutrino (photon). Similarly, the inventors show how a deuteron ("D") can capture one "heavy" electron to create two ultra low momentum neutrons and a neutrino as follows:

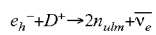
$$e_h^- + D^+ \rightarrow 2n_{ulm} + \overline{v}_e$$

Importantly, the Coulomb barrier is not a factor in either of these reactions. In fact, in this situation, the juxtaposition of unlike charges actually helps these reactions to proceed.

Further aspects of the present invention are set forth in the scientific paper found in Attachment 2 (found in the Cornell University physics preprint archive at http://www.arxiv.org/pdf/cond-mat/0509269; this preprint dated Sep. 10, 2005, has also been submitted to a refereed print journal) by A. Widom and L. Larsen, the present inventors, entitled: "Absorption of Nuclear Gamma Radiation by Heavy Electrons on Metallic Hydride Surfaces." The attached paper is incorporated by reference and is intended to form part of this disclosure; its abstract states that:

"Low energy nuclear reactions in the neighborhood of metallic hydride surfaces may be induced by heavy surface electrons. The heavy electrons are absorbed by protons producing ultra low momentum neutrons and neutrinos. The required electron mass renormalization is provided by the interaction between surface electron plasma oscillations and surface proton oscillations. The resulting neutron catalyzed low energy nuclear reactions emit copious prompt gamma radiation. The heavy electrons which induce the initially produced neutrons also strongly absorb the prompt nuclear gamma radiation. Nuclear hard photon radiation away from metallic hydride surfaces is thereby strongly suppressed."

The arXiv cond-mat/0509269 preprint provides a theoretical explanation for effective suppression of gamma radiation and efficient absorption of ultra low momentum neutrons in LENR systems. It is explained why neutron absorption by nearby nuclei in LENR systems do not result in the external release of large, easily observable fluxes of hard energetic gammas and X-rays. Specifically, the present inventors show that surface electrons bathed in already soft radiation can convert the hard gamma radiation into soft radiation. The number of gammas in the energetic region from 0.5 MeV to 10.0 MeV is strongly suppressed at the condensed matter surface and the energy appears as softer (less energetic) heat radiation. The short mean free paths of both ultra low momentum neutrons and hard gamma radiation are computed in the neighborhood of condensed matter surfaces. In low energy nuclear reaction systems, the gamma absorbing layer of surface electrons already bathed in soft radiation has the ability to stop a 5 MeV gamma ray in less than two nanometers—two-billionths of a meter. With existing materials technologies, it would take ~10 cm of lead, ~25 cm of steel, or ~1 meter of very heavy concrete to accomplish the same degree of shielding.

Additional scientific evidence supporting the claims of the present Invention can be found the scientific paper found in Attachment 3 (found in the Cornell University physics preprint archive at http://www.arxiv.org/pdf/cond-mat/0602472; this preprint dated Feb. 20, 2006, has also been submitted to a refereed print journal) by A. Widom and L. Larsen, the present inventors, entitled: "*Nuclear Abundances in Metallic Hydride Electrodes of Electrolytic Chemical Cells.*" The attached paper is incorporated by reference and is intended to form part of this disclosure; its abstract states that:

"Low energy nuclear transmutations have been reported in experimental chemical electrolytic cells employing metallic hydride electrodes. Assuming that the nuclear transmutations are induced by ultra low momentum neutron absorption, the expected chemical cell nuclear abundances are discussed on the basis of a neutron optical potential model. The theoretical results are in satisfactory agreement with available experimental cell chemical data. Some implications of these laboratory transmutations for r- and s-process models of the neutron induced solar system and galactic nuclear abundance are briefly explored."

The arXiv cond-mat/0602472 preprint discusses a model for the anomalous patterns of nuclear abundances experimentally observed in metallic hydride cathodes of electrolytic chemical cells. These experimental transmuted nuclear abundances have been something of a scientific enigma since they were first published by Prof. George H. Miley and other researchers such as Mizuno beginning in 1996. The data is interpreted as primarily the result of a neutron absorption spectrum. Ultra low momentum neutrons are produced (along with virtually inert neutrinos) by the weak interaction annihilation of electrons and protons when the chemical cell is driven strongly out of equilibrium. Appreciable quantities of these neutrons are produced on the surface of a metal hydride cathode in an electrolytic cell. The ultra low momentum of these neutrons implies extremely large cross-sections for absorption by various "seed" nuclei present on or near the surface of a cathode in a chemical cell, increasing their nuclear masses. The increasing masses eventually lead to instabilities relieved by beta decay processes, thereby increasing the nuclear charge. In this manner, "... most of the periodic table of chemical elements may be produced, at least to some extent." The experimentally observed pattern of distinctive peaks and valleys in the transmuted nuclear mass-spectrum reflect the neutron absorption resonance peaks as theoretically computed employing a simple and conventional neutron optical model potential well. An intriguing possibility is briefly noted in the paper. The varieties of different elements and isotopes that we find in the world around us were thought to arise exclusively from nuclear reactions in stars and supernova explosions. However, recent astrophysical calculations have indicated some weaknesses in the above picture regarding the strengths of the neutron flux created in a supernova. Our paper suggests that, "It appears entirely possible that ultra low momentum neutron absorption may have an important role to play in the nuclear abundances not only in chemical cells but also in our local solar system and galaxy."

In the context of the present Invention, the data utilized from references cited in the above preprint arXiv cond-mat/0602472 show clear evidence of abundant transmutation reactions as a result of the absorption of ultra low momentum neutrons by local nuclei located on the cathode of a chemical cell. Large fluxes of expected prompt and delayed gamma radiation should have been observed that would have been commensurate with the observed rates of neutron absorption and nuclear transmutation reactions that occurred in the chemical cells. In fact, no significant gamma or hard X-ray fluxes were observed in any of the experiments. Such observational facts support the claim that the gamma shielding mechanism encompassed in the present Invention must be operating in these systems.

Additional scientific evidence supporting the claims of the present invention can be found the scientific paper found in Attachment 4 (found in the Cornell University physics preprint archive at http://www.arxiv.org/pdf/nucl-th/0608059; this preprint dated Aug. 25, 2006, has also been submitted to a refereed print journal) by A. Widom and L. Larsen, the present inventors, entitled: *"Theoretical Standard Model Rates of Proton to Neutron Conversions Near Metallic Hydride Surfaces."* The attached paper is incorporated by reference and is intended to form part of this disclosure; its abstract states that:

"The process of radiation induced electron capture by protons or deuterons producing new ultra low momentum neutrons and neutrinos may be theoretically described within the standard field theoretical model of electroweak interactions. For protons or deuterons in the neighborhoods of surfaces of condensed matter metallic hydride cathodes, such conversions are determined in part by the collective plasma modes of the participating charged particles, e.g. electrons and protons. The radiation energy required for such low energy nuclear reactions may be supplied by the applied voltage required to push a strong charged current across a metallic hydride surface employed as a cathode within a chemical cell. The electroweak rates of the resulting ultra low momentum neutron production are computed from these considerations."

The arXiv cond-mat/0600059 preprint shows computations demonstrating that the proton to ultra low momentum neutron conversions claimed by the present inventors can take place at substantial production rates inferred from the experimental data that are on the order of $10^{12}$ to $10^{14}$ ultra low momentum neutrons per $cm^2$ per second.

Together, the four scientific papers by the present inventors comprising Attachments 1-4 can explain all of the major features exhibited in many seemingly anomalous experiments (lumped under the unfortunate term cold fusion) that have previously been regarded by many as theoretically inexplicable. In contrast to other earlier theories involving penetration of Coulomb barriers, the present Invention's methods and apparatus for creating low energy nuclear reactions are scientifically reasonable within the context of the well-accepted standard model of electroweak interaction physics. The key process responsible for producing most of the experimentally observed anomalies explained by these publications is not any form of cold fusion, nor is it any form of fission. On the contrary, the key physical processes driving the unique behavior of these systems are primarily weak interactions. The four Attachments extend well-accepted Standard Model physics to include collective effects in condensed matter; no new microscopic physics is assumed or is necessary to explain the data.

B. Overview of the Physical Processes Underlying the Invention

A preferred device according to various aspects of the present invention would have a substrate, such as a well-bonded metallic or non-metallic substrate. Above the substrate is a metallic surface capable of supporting surface plasmon polaritons (SPPs) and of forming a hydride or deuteride. Palladium and Nickel are examples of a suitable or preferred material. Above that metallic surface is a fully covered surface layer of protons or deuterons. These are fully loaded H or D. Preferred methods for loading H or D include an enforced chemical potential difference, and/or electrical current, and/or a pressure gradient. The production of ULMNs and heavy electrons can be further stimulated with, for example, the application of preferred frequencies of laser light to the working surface.

On the working surface are nanoparticles of preferred sizes and shapes composed of preferred target materials. These are deposited on the working surface of the device. One example of a preferred target material is a palladium-lithium alloy. Also above the surface layer, shown representatively are nearby patches of collectively oscillating protons or deuterons. The diameters of such patches are generally several microns. A layer of surface plasmon polaritons is established, located in and around the surface layer and these patches. Incident on the described structures is an enforced flux of protons or deuterons, which must pass through the working surface. The Born-Oppenheimer Approximation breaks down on the upper working surface.

In the present invention, preferred materials are able to support and maintain a shallow, surface-covering "electron sea" (having an associated "skin depth" both above and below the surface of the preferred material) comprised of collective electron excitations known as surface plasmon polaritons (SPPs). SPPs support two-way transfers of energy: (a) on one hand, they intrinsically prefer to radiate energy in the infrared and soft X-ray regions of the EM spectrum; (b) on the other hand, energy can be transferred to SPPs by coupling to other phenomena such as: enhanced chemical potential differences across the SPP interface; nonequilibrium ion fluxes across the SPP layer; and/or incident laser radiation of appropriate wavelengths on a suitably roughened surface.

When the surface or near subsurface regions of preferred hydride/deuteride-forming materials (e.g. palladium, nickel, or some other preferred material) are deliberately loaded with hydrogen isotopes above a certain threshold level (preferably to a ratio of 0.70-0.80 or more of protons and/or deuterons to metal atoms) the following happens:

1. Numerous localized surface "patches" comprised of large numbers of coherently oscillating protons and/or deuterons appear spontaneously at the interface on the surface of the material. These "patches" are situated within the skin depth of the SPPs.
2. At the surface/interface, and especially in and around the patches of coherently oscillating hydrogenous atoms, the Born-Oppenheimer Approximation breaks down. This breakdown of screening substantially reduces the effectiveness of normal charge screening mechanisms that commonly occur in many condensed matter systems. This breakdown of charge screening, in conjunction with the loose coupling of SPPs to local collective oscillations of "patches" of ionized hydrogenous atoms, allows the formation of extremely high local electric fields within the collectively oscillating "patches." These intense local E fields renormalize and increase the mass of local SPP electrons exposed to those fields. When a critical threshold of field strength is reached, renormalized "heavy" electrons have sufficient mass to react spontaneously with nearby protons or deuterons to form ultra low momentum neutrons (ULMNs). The critical field threshold is roughly on the order of $10^{11}$ V/m, which is about the same magnitude as the strength of the Coulomb field seen by the electron in a hydrogen atom.
3. ULMNs are captured on nearby atoms, catalyzing a variety of different types of low-energy nuclear reactions (LENRs). Unlike neutrons at thermal energies and higher, the invention's ULMNs have unusual properties that include very large wavelengths (i.e. $\sim 10^{-3}$ cm) and very high capture (absorption) cross-sections. As a result, mean free paths of ULMNs in the apparatus of the invention are very short: only $\sim 10^{-6}$ cm.

It is well known that neutron captures by various elements commonly result in prompt gamma emissions. It is also well known that neutron-rich isotopes of many elements (excluding certain very high-A elements such as uranium, plutonium) are short-lived and decay mainly via weak force beta processes. Individual beta decays can be very energetic and can have positive Q-values ranging up to ~20 MeV; many of them also emit gammas. Q-values of many beta decays compare favorably to net Q-values that are achievable with D-D/D-T fusion reactions (total 25 MeV). Various different chains of beta decays can thus be utilized for generating power.

In certain aspects of the present invention, preferably chains of reactions characterized mainly by absorption of ULMNs and subsequent beta decays are employed. These are collectively referred to as low energy nuclear reactions—"LENRs". In some cases, preferred ULMN-catalyzed chains of nuclear reactions may have relatively benign beta decays interspersed with occasional "gentle" fissions of isotopes of other elements and occasional alpha-particle decays. These may have Q-values ranging from one or two MeV up to 20 MeV, in contrast to the very energetic 200+MeV Q-value of the fission of very high-A, Uranium-235.

SPPs, as discussed in the above mentioned reference, serve multiple roles in the context of the invention. Specifically, SPPs comprised of "normal-mass" electrons and numerous contiguous patches containing heavy electrons created in an apparatus according to the present invention can:

Absorb energy from the external environment in specific types of coupling and modes (both "normal mass" electrons and heavy electrons; normal-mass electrons can transfer energy to heavy ones), and/or React spontaneously with nearby protons and/or deuterons to create ultra low momentum neutrons that can be captured and used to catalyze nuclear power-producing and/or transmutation LENRs (heavy electrons only), and/or Reradiate energy of absorbed gamma photons as many lower-energy infrared and soft X-ray photons. In this role, it serves as a fully integrated "shield" against prompt and delayed gammas produced by neutron-catalyzed LENRs occurring within the invention's apparatus and/or gamma radiation incident on the apparatus from external sources (heavy electrons only).

Prompt gammas may be produced when ULMNs are initially captured by nuclei situated in close proximity to "patches" of coherently oscillating hydrogen isotopes in which the ULMNs are generated. Delayed gammas are produced by subsequent decay chains (preferably mostly cascades of beta decays) of new isotopes created through capture of ULMNs by nearby "target" atoms. By virtue of their additional mass, and unlike the vacuum state, heavy electrons in the invention's surface plasmon polaritons have the ability to fully absorb "hard" gamma photons and reradiate gamma photon energy in the form of an ensemble of a much larger number of lower-energy "soft" photons, mainly in the infrared and soft X-ray portions of the EM spectrum.

In the Invention, connections between nuclear and chemical processes occur at moderate temperatures and pressures within the invention's condensed matter system. In the invention, SPPs (comprised of heavy electrons and electrons of ordinary mass) help mediate a dynamic, two-way energy exchange between nuclear and non-nuclear processes. In effect, the apparatus of the invention operates as an energy transducer between nuclear and chemical realms.

In an apparatus embodying the present invention, the mean free path of a gamma photon with energy between ~0.5 MeV and ~10.0 MeV can be (and preferably is) extraordinarily short: only $\sim 3.4 \times 10^{-8}$ cm, or less than a nanometer. This property has the effect of suppressing emission of externally detectable gamma radiation by the invented apparatus and shielding against incident gamma radiation emanating from external sources in almost any direction. Depending on the specifics of the preferred apparatus, selected materials, and operating conditions, what may be observed experimentally can include:

No significant gamma emissions, mostly just internally absorbed infrared (IR) radiation and charged particle interactions (produced by LENRs) with lattice phonons. Together, they are detected as substantial amounts of measured "excess heat" in a calorimeter; such excess heat would typically be accompanied by various types of nuclear transmutation products; in addition, this may sometimes be accompanied by small, barely detectable fluxes of soft X-rays [Reference Example: "Large excess heat production in Ni—H systems", Focardi et al, *Il Nuovo Cimento,* 111, No. 11, November 1998]

Significant numbers of nuclear transmutation products in conjunction with little or no measurable excess heat, no detectable gamma emissions, and no detectable soft X-rays [Reference Example: "Elemental Analysis of Pd Complexes: Effects of $D_2$ Gas Permeation", Iwamura et al, *Japanese Journal of Applied Physics*, 41, No. 7A, pp. 4642-4650, July 2002]

C. Gamma Shielding

An important application of the present invention is, as noted above, for shielding against gamma radiation. This is achieved with heavy electrons produced in the manner described already. FIG. 18 represents an application of the present invention for gamma shielding. As seen in FIG. 18, a heavy electron produced by the present invention can receive a gamma photon and re-radiate the gamma photon's energy in the form of multiple, lower frequency, lower energy photons, e.g., infrared and soft X-ray photons.

D. Description of Figures Explaining Scientific Aspects of the Invention

A high-level conceptual overview of aspects of the present invention is illustrated in FIG. 19. The invented methods and apparatus utilize "ordinary" surface plasmon polariton electrons 2 (referred to in FIG. 19 as "SPPs") and heavy-mass surface plasmon polariton electrons 4, hydrogen isotopes 6, surfaces of metallic substrates 8, collective many-body effects that produce very high electric fields 3, and weak interactions 10 in a controlled manner to generate ultra low momentum neutrons ("ULMNs") 12 (that can be used to trigger low energy nuclear transmutation reactions 14 and produce heat 16), neutrinos 18, and heavy electrons 4 that can effectively serve as a gamma shield for gammas produced in local nuclear reactions 20 as well as screen incident gamma radiation from outside sources 22. The physical system enabled by the invention collectively creates what is effectively a "transducer" mechanism 24 (represented by the bi-directional arrow in the center of FIG. 19) that permits controllable two-way transfers of energy back-and-forth between chemical 26 and nuclear 28 energy realms in a small-scale, low-energy, scalable condensed matter system at comparatively modest temperatures and pressures.

The present invention requires an input of energy to create heavy surface plasmon polariton electrons 4 and ultra low momentum neutrons 12; net excess energy is released whenever the nuclear binding energy released by subsequent weak interactions 10, such as beta decays 10 or neutron creation 10, exceeds the required input energy. Utilizing the transducer mechanism 24 of the invention, energy may be input to the system via interactions with "ordinary" surface plasmon polariton electrons 2 and heavy-mass surface plasmon polariton electrons 4.

According the present invention, required energy to make heavy electrons 4 and ultra low momentum neutrons 12 can be input via alternative methods that include, singly or in combination: (a) irradiation of the surface plasmon polariton electrons with "beams" of electrons 30 such as those found in an electrical current; and/or (b) creation of a flux of ionized protons or deuterons 32 across the surface via a pressure gradient or difference in chemical potential; (c) and/or irradiation of the surface with other types of energetic ions 34; and/or (d) given appropriate surface roughness to properly couple momentum, irradiation of the surface with light of the appropriate frequency from a selected laser 36.

The present invention functions as gamma shield by its heavy electrons 4 absorbing gammas (20 which arise either from local low energy nuclear reactions or as 22 incident gamma radiation coming from the outside) and then re-radiating the absorbed gamma energy as a mixture of infrared photons 38 and some soft X-rays 40. A combination of infrared photons 38, soft X-rays 40, and energetic electrons and charged particles 42, interact with lattice phonons 44 to produce excess heat 16.

E. Description of Preferred Embodiments

FIG. 20 is a representative side view of an ultra low momentum neutron generator and integrated gamma shield according to aspects of the present invention. It consists of: randomly positioned surface "patches" 6 from one to ten microns in diameter comprising a monolayer of collectively oscillating protons or deuterons; a metallic substrate 46 which may or may not form bulk hydrides; collectively oscillating surface plasmon polariton electrons 2, 4 that are confined to metallic surface regions (at an interface with some sort of dielectric) within a characteristic skin depth averaging 200-300 Angstroms for typical metals such as copper and silver; an upper working region 48 which may be filled with a liquid, gas, solid-state proton conductor, or a mild vacuum; other substrate 50 which must be able to bond strongly with the metal substrate surface 8 and have good thermal conductivity but which may or may not be permeable to hydrogen or deuterium and/or form hydrides; and the working surface 8 of the metallic substrate 46 which may or may not have nanoparticles of differing compositions affixed to it. The upper working region 48 either contains a source of protons/deuterons or serves as a transport medium to convey ions, and/or electrons, and/or photons to the working surface 8 upon which the SPPs 2, 4 are found.

FIG. 21 is a representative top view of an ultra low momentum neutron generator and integrated gamma shield according to aspects of the present invention. It shows randomly positioned "patches" of collectively oscillating protons or deuterons 6 located on top of the metallic substrate 46 and its working surface 8.

FIG. 22 is a representative side view of an ultra low momentum neutron generator and integrated gamma shield according to aspects of the present invention. It shows the ultra low momentum neutron generator of FIG. 20 with randomly positioned nanoparticles 52 affixed to the working surface 8. It is important that the maximum dimensions of the nanoparticles are less than the skin depth of the surface plasmon polariton electrons 2, 4.

FIG. 23 is a representative top view of an ultra low momentum neutron generator and integrated gamma shield according to aspects of the present invention. It shows the ultra low momentum neutron generator of FIG. 21 with randomly positioned nanoparticles 52 affixed to the working surface 8 amidst patches of collectively oscillating protons or deuterons 6.

FIG. 24 is a representative schematic side view of one alternative preferred embodiment of a ultra low momentum neutron power generation system with integrated gamma shielding according to aspects of the present invention. It shows a pressurized reservoir of hydrogen or deuterium gas 54 connected via a valve 56 and related piping with an one-way check valve and inline pump 58 that injects gas under pressure (>1 atmosphere) into a sealed container with two open cavities 60, 62 separated and tightly sealed from each other by a one or two layer ultra low momentum neutron generator. The side walls 64 of the cavities 60, 62 are thermally conductive, relatively inert, and serve mainly to provide support for the ultra low momentum neutron generator. The top and bottom walls 68, 70 of the two cavities 60, 62 must constructed of materials that are thermally conductive. Optionally, in other alternative embodiments in which a laser 36 and electrical connector 66 is not optionally installed on the top wall 68, then the top 68 and bottom 70 walls can be made electrically conductive and a desired electrical potential gradient can be imposed across the ultra low momentum neutron generator. If an additional chemical potential in the ultra low momentum neutron generator is desirable, the ultra low momentum neutron generator can optionally be constructed with two layers 46, 50, both of which must be able to form bulk metallic hydrides, but their materials are selected to maximize the difference in their respective work functions at the interface between them. Each layer 46, 50 of the ultra low momentum neutron generator must preferably be made thicker than the skin depth of surface plasmon polaritons, which is about 20-50 nanometers in typical metals. If a semiconductor laser 36 is optionally installed, it should be selected have the highest possible efficiency and its emission wavelengths chosen to closely match the resonant absorption peaks of the SPPs found in the particular embodiment. The pressure gradient (from 1 up to 10 atmospheres) across the ultra low momentum neutron generator insures that a sufficient flux of protons or deuterons is passing through the ultra low momentum neutron generator and integrated shield's working surface 8. Finally, the outermost walls of the container 72, completing enclosing the ultra low momentum neutron generator unit (except for openings necessary for piping, sensors, and electrical connections), can be either solid-state thermoelectric/thermionic modules, or alternatively a material/subsystem that has an extremely high thermal conductivity such as copper, aluminum, Dylyn diamond coating, PocoFoam, or specially engineered heat pipes. In the case of the alternative embodiment having a ultra low momentum neutron generator integrated with thermoelectric/thermionic devices, high quality DC power is generated directly from the ultra low momentum neutron generator's excess heat; it serves as a fully integrated power generation system. In the other case where the container is surrounded by some type of thermal transfer components/materials/subsystems, the ultra low momentum neutron generator functions as an LENR heat source that can be integrated as the "hot side" with a variety of different energy conversion technologies such as small steam engines (which can either run an electrical generator or rotate a driveshaft) and Stirling engines.

F. Description of Methods of the Invention

In the case of a metallic substrate 46 that forms a bulk hydride, the first step in the operation of the Invention is to deliberately "load" 90-99% pure hydrogen or deuterium into a selected hydride-forming metallic substrate 46 such as palladium, nickel, or titanium. Examples of alternative preferred methods for such loading (some can be combined) include a: 1. Pressure gradient; 2. Enforced difference in chemical potential; and/or 3. Imposition of electrochemical potential across the working surface.

When a metallic hydride substrate 46 is "fully loaded" (that is, the ratio of H or D to metal lattice atoms in the metallic hydride substrate reaches a preferred value of 0.80 or larger), protons or deuterons begin to "leak out" and naturally form densely covered areas in the form of "patches" 6 or "puddles" of positive charge on the working surface 8 of the metallic hydride substrate 46. The appearance of these surface patches of protons or deuterons can be seen clearly in thermal neutron scattering data. These surface patches 6 of protons or deuterons have dimensions that are preferably from one to ten microns in diameter, and are scattered randomly across the working surface 8. Importantly, when these surface patches 6 form, the protons or deuterons that comprise them spontaneously begin to oscillate together, collectively, in unison.

The Born-Oppenheimer approximation will automatically break down in local regions of the working surface 8 that are in close proximity to surface patches 6 of collectively oscillating protons or deuterons. At this point, the collective motions of the electrons comprising the surface plasmon polaritons 2, 4 become loosely coupled to the collective oscillations of local surface "patches" 6 of protons or deuterons. Energy can now be transferred back-and-forth 24 between the surface patches 6 of protons or deuterons and the entire "sea" of SPPs 2, 4 covering the working surface 8.

Electromagnetic coupling between SPP electrons 2, 4 and collectively oscillating patches of protons or deuterons 6 dramatically increases strength of electric fields 3 in the vicinity of the patches 6. As the local electric field strength of a patch 3 increases, per the theory of Quantum Electrodynamics, the masses of local SPP electrons 4 exposed to the very high fields 3 (preferably >$10^{11}$ V/m) are renormalized upward (their real mass is increased). Such field strengths 3 are essentially equivalent to those normally experienced by inner-shell electrons in typical atoms. Thus, in the invention heavy electrons, $e^{*-}$ 4 are created in the immediate vicinity of the patches 6 in and around the working surface 8. SPP electrons 2, 4 in and around the patches can be heavy 4, those located away from the patches are not 2.

Beyond the initial loading phase to form a fully-loaded hydride substrate 46, electric fields 3 in the vicinity of the H or D patches 6 must be further increased by injecting additional energy into the "sea" of surface plasmon polaritons 2, 4. Ultimately, this has the effect of further increasing the rate of ultra low momentum neutron (ULMN) production. This can be accomplished by using one or more the following preferred methods (some can be combined):

1. Creating a nonequilibrium flux of protons or deuterons as ions 32 across the working surface interface 8 defined by the surface of the metallic hydride substrate (this is a rigid requirement in the case of a metallic substrate 46 that forms bulk hydrides); and/or,
2. Optionally, irradiating the metallic substrate's working surface 8 with laser 36 light of the appropriate wavelength that is matched to the photon absorption resonance peaks of the SPPs 2, 4; this also has related surface roughness requirement to insure momentum coupling with the laser photons 36; and/or,
3. Optionally, irradiating the metallic substrate's 46 working surface 8 with an appropriately intense beam of either energetic electrons 30 or other preferred types of energetic positive ions 34 besides protons or deuterons 32.

When the renormalized masses of local SPP heavy electrons 4 reach critical threshold values, they will react spontaneously with collectively oscillating protons or deuterons in adjacent patches 6 in a weak interaction 10, thus producing ultra low momentum neutrons 12, and neutrinos 18. As stated earlier, the two types of weak interaction nuclear reactions 10 between protons or deuterons 6 and heavy electrons 4 that produce ultra low momentum neutrons 12 and neutrinos 18 are as follows:

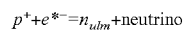
$p^+ + e^{*-} = n_{ulm} +$ neutrino

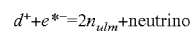
$d^+ + e^{*-} = 2n_{ulm} +$ neutrino

It must be emphasized that the strength of electric fields 3 just above the patches 6 is crucial to the production of ultra low momentum neutrons 12. If the local electric fields 3 are not high enough (e.g., $\ll 10^{11}$ V/m) critical field strength thresholds will not be reached and the SPP electrons 2, 4 will be short of the minimum mass necessary to react spontaneously with protons or deuterons 6 to form ultra low momentum neutrons 12. It is well known in nanotechnology and the semiconductor industry that micron- and nano-scale surface features/topology and the size/geometry/placement of nanoparticles on surfaces 52 can have dramatic effects on local electromagnetic fields 3. The size regime for such effects starts at tens of microns and extends down to the nanoscale at roughly 5 nanometers. For example, it is known in nanotechnology that the relative size, composition, geometry, and relative placement (positioned to touch each other in a straight line versus a more close-packed arrangement) of nanoparticles on surfaces 52 can cause the local electric fields 3 to vary by $10^5$. That factor is easily the difference between reaching the necessary thresholds to create ultra low momentum neutrons 12 or not. The implication of these facts is that to successfully produce substantial percentages of good working ultra low momentum neutron and integrated gamma shield generator devices and operate them for significant periods of time, techniques must be used that are capable of nanoscale control of initial fabrication steps and materials/designs/methods must be selected that can maintain key surface properties during extended device operation. In that regard, ultra low momentum neutron generators with an upper working region 48 that is filled with hydrogen or deuterium gas are more tractable from a surface stability standpoint, as compared to electrolytic ultra low momentum neutron generators with integrated gamma shields using an aqueous electrolyte in which the nanoscale surface features of the cathodes typically change dramatically over time.

H. Description of Additional Examples of Preferred Embodiments

FIGS. 22 and 23 illustrate a ultra low momentum neutron generator and integrated gamma shield in which nanoparticles 52 are fabricated and affixed to its working surface 8. FIG. 22 is a representative side view, not drawn to scale; FIG. 23 is a representative top view, also not drawn to scale. According to this particular embodiment, an ultra low momentum neutron generator and integrated gamma shield would be constructed with a metallic substrate 46 that forms hydrides or deuterides, such as palladium, titanium, or nickel, or alloys thereof. Above that substrate is a working surface 8 capable of supporting surface plasmon polaritons 2, 4 and the attachment of selected nanoparticles 52. The thickness of the substrate 46 and the diameter of the surface nanoparticles 52 should be fabricated so that they do not exceed the skin depth of the SPPs 2, 4. The substrate 46 is fully loaded with H or D and the working surface 8 has an adequate coverage of patches 6 of protons or deuterons. In this embodiment the surface nanoparticles 52 serve as preferred target materials for ultra low momentum neutron 12 absorption during operation of the generator and gamma shield. One example of a preferred nanoparticle target material for ultra low momentum neutron heat generation applications are a variety of palladium-lithium alloys.

Palladium-lithium alloys represent an example of a preferable nanoparticle target material 52 because: (a.) certain lithium isotopes have intrinsically high cross-sections for neutron absorption; (b.) nanoparticles composed of palladium-lithium alloys adhere well to palladium substrates; (c.) palladium-lithium alloys readily form hydrides, store large amounts of hydrogen or deuterium, and load easily; and finally (d.) there is a reasonably small, neutron-catalyzed LENR reaction network starting with Lithium-6 that produces substantial amounts of energy and forms a natural nuclear reaction cycle. Specifically, this reaction network operates as follows (the graphic is excerpted from the referenced Widom-Larsen paper in Attachment 1 that published in *The European Physical Journal C—Particles and Fields*):

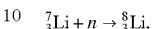
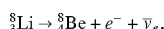
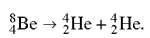
(30)

The chain (30) yields a quite large heat Q for the net nuclear reaction

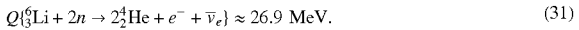 (31)

Having produced $^4$He products, futher neutrons may be employed to build heavy helium "halo nuclei" yielding

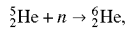
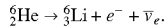
(32)

The chain (32) yields a moderate heat for the net $^6_3$Li producing reaction

 (33)

The reactions (30) and (32) taken together form a nuclear reaction cycle. Other possibilities include the direct lithium reaction The net amount of energy (Q) released in the above example of an LENR network 14 compares favorably with that of strong interaction fusion reactions, yet it does not result in the production of energetic neutrons, hard radiation, or long-lived radioactive isotopes. Thus, substantial amounts of heat energy 16 can be released safely by guiding the course of complex LENR nucleosynthetic and decay processes 14; at the same time, emission of hard gamma radiation 20 is suppressed by the Invention's shielding mechanism.

Other local "target" nanoparticles 52 on working surfaces 8 may have an isotopic composition that is deliberately chosen to minimize the production of excess heat. Gadolinium would be one example of such a material; it can absorb many neutrons 12 before creating unstable isotopes. An alternative strategy to accomplish the same goal would be to control the local electromagnetic fields 3 across the working surface 8 in such a way that they are "clamped" at values just below the critical threshold for ultra low momentum neutron production. In that alternative embodiment there is a requirement for energy input into the system, the gamma shield is present, but no weak interaction nuclear reactions are occurring. In both such alternative preferred embodiments, the device will function mainly as a gamma shield which can be used to strongly attenuate incident gamma radiation coming from outside sources 22 in the range of ~0.5 MeV to ~10.0 MeV.

Further Commercial Utility of the Invention

There are additional important commercial uses for preferred embodiments of the invention that provide low cost, low mass, highly effective gamma shielding. Important applications enabled by the present invention include:

Compact, long-lived portable power generation devices that can sustain in situ operation of ultra low momentum neutron-catalyzed networks of LENRs without any need for significant quantities of additional shielding because the system's heavy electrons function as an integrated gamma shield. Such devices can be designed to exploit differences between the aggregate nuclear binding energies of preferred initial seed materials and the final products (isotopes) of the nuclear reaction networks to create an overall net release of energy, primarily in the form of excess heat. This heat would be generated primarily by preferred weak interactions such as beta decays. When integrated with a variety of preferred types of energy conversion technologies, nuclear heat source devices enabled by the invention could be valuable in a variety of civilian and military applications; and Compact commercial systems for transmutation of various types of preferred seed materials/isotopes to produce significant recoverable quantities of specific, commercially useful isotopes. Such systems would generally require little or no additional shielding because the system's heavy electrons function as an integrated gamma shield.

Low mass, highly effective shielding against incident gamma radiation for manned aerospace systems used in military or space environments; gamma shielding for radiation-sensitive electronic components in same.

Compact, low mass, low cost gamma shielding for sealed containers used in the transportation of high-level radioactive waste.

Compact, low mass, low cost gamma shielding for use in surrounding sealed enclosures for gamma-emitting isotopes employed in various medical and industrial applications.

In the event that nuclear isomer triggering problems are eventually solved, the invention can provide shielding against the effects of isomer weapons; in the case of isomer storage technologies, it enables effective conversion of gammas into more usable forms of energy.

In addition to their utility as an effective gamma shield, the heavy electrons and ultra low momentum neutrons of the invention can also be used to control the transition rates of weak nuclear interactions, in particular beta decay. The number of beta decay events can be increased or decreased depending on the number of surface heavy electron states created in the neighborhood of a beta decaying nucleus. A nuclear beta decay event may be written symbolically as:

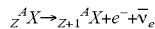

i.e. a nucleus with Z protons and (A−Z) neutrons transmutes into a new nucleus with (Z+1) protons and (A−Z−1) neutrons emitting and electron e⁻ and an anti-neutrino. The decay rate depends strongly on the energy of the electron plus the energy of the neutrino which together determine the nuclear heat of reaction. The larger the heat of reaction the faster the beta decay rate. Any increase in the electron mass due to condensed matter renormalization, lowers the heat of reaction and thereby lowers the rate of beta decay. For example, the most simple beta decay is that of a neutron

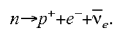

Here, p⁺ represents a proton. The neutron will decay if isolated in the vacuum. The neutron will not decay if it is located inside of a nucleus which is stable to beta decay because the heat of reaction would be negative. A neutron within a nucleus will decay if the heat of beta decay reaction is positive. The more positive the heat of reaction, the faster will be the beta decay rate.

The decay of a single neutron will be slowed down if the final electron state has a higher mass because the resulting heat of reaction will be smaller. On may thereby control the rate of beta decay reactions of nuclei on the surface of metallic hydrides by controlling the surface density of heavy electron states. Since the heavy mass states are central for neutron catalyzed nuclear transmutations, the control of the density of heavy electrons states also controls the rates of nuclear transmutation catalysis.

Thus it will be appreciated that in addition to a number of other uses the present invention can provide a low mass, low cost, high attenuation gamma photon shield that can be used in a variety of different commercial applications.

The invention claimed is:

1. A method of shielding gamma radiation comprising: producing a region of heavy electrons; and
receiving incident gamma radiation in said region,
said heavy electrons absorbing energy from said gamma radiation and re-radiating it as photons at a lower energy and frequency.

2. The method of claim 1 including providing surface plasmon polaritons and producing said heavy electrons in said surface plasmons polaritons.

3. The method of claim 1 including providing multiple regions of collectively oscillating protons or deuterons with associated heavy electrons.

4. The method of claim 1 including providing a plurality of nanoparticles of a target material on a metallic surface capable of supporting surface plasmons, said region of heavy electrons being associated with said metallic surface.

5. The method of claim 1 including inducing a breakdown in a Born-Oppenheimer approximation.

6. The method of claim 1 including providing low energy nuclear reactions catalyzed by ultra low momentum neutrons within said region of heavy electrons.

7. The method of claim 1 wherein said step of providing a region of heavy electrons includes: providing a metallic working surface capable of supporting surface plasmons and of forming a hydride or deuteride; fully loading said metallic surface with H or D thereby to provide a surface layer of protons or deuterons capable of forming coherently oscillating patches; and developing at least one patch of coherently or collectively oscillating protons or deuterons on said surface layer.

8. The method of claim 7 including breaking down the Born-Oppenheimer approximation on said upper working surface.

9. The method of claim 7 wherein said surface material comprises palladium or a similar metal and/or alloy capable of forming a hydride or deuteride; and providing a plurality of target nanoparticles on said metallic working surface.

10. The method of claim 9 wherein said target nanoparticles comprise a palladium-lithium alloy.

11. The method of claim 7 further comprising directing laser radiation to said working surface to stimulate and transfer energy into said surface plasmons.

12. The method of claim 7 wherein said H or D surface layer is fully loaded by one or more of an enforced chemical potential difference, an electrical current, or a pressure gradient.

13. The method of claim 1 including forming ultra-low momentum neutrons.

14. The method of claim 1 wherein said gamma radiation comprises gamma photons having energies in the range of about 0.5 MeV to about 10.0 MeV.

15. The method of claim 14 wherein said gamma photons result from neutron capture.

16. The method of claim 14 wherein said gamma photons result from an external source.

17. A gamma radiation shield comprising: a substrate; a metallic working surface capable of supporting surface plasmons and of forming a hydride or deuteride, located above said substrate; above said metallic surface, a surface layer of protons or deuterons comprising fully loaded H or D; at least one patch of collectively oscillating protons or deuterons associated with said surface layer; a region of surface plasmon polaritons located above the surface layer and said at least one patch; and a flux of protons or deuterons incident on said surface plasmon polaritons, surface layer, and working surface.

18. The shield of claim 17 wherein said surface material comprises palladium or a similar metal and/or alloy capable of forming a hydride or deuteride.

19. The shield of claim 17 further comprising laser radiation incident on said working surface to stimulate and transfer energy into said surface plasmon polaritons.

20. The shield of claim 17 further comprising a plurality of target nanoparticles on said metallic working surface.

21. The shield of claim 20 wherein said target nanoparticles comprise a palladium-lithium alloy.

22. The shield of claim 17 wherein said H or D surface layer is fully loaded by one or more of an enforced chemical potential difference, an electrical current, or a pressure gradient.

23. The shield of claim 17 wherein said at least one patch produces heavy electrons;

and wherein said heavy electrons absorb gamma radiation.

* * * * *